(12) United States Patent
Huang et al.

(10) Patent No.: US 12,020,611 B2
(45) Date of Patent: *Jun. 25, 2024

(54) DISPLAY PANEL AND DISPLAY DRIVE METHOD THEREOF, AND DISPLAY DEVICE

(71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventors: Yao Huang, Beijing (CN); Weiyun Huang, Beijing (CN); Yue Long, Beijing (CN); Chao Zeng, Beijing (CN); Meng Li, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

This patent is subject to a terminal disclaimer.

(21) Appl. No.: 18/115,800

(22) Filed: Mar. 1, 2023

(65) Prior Publication Data
US 2023/0206799 A1 Jun. 29, 2023

Related U.S. Application Data

(63) Continuation of application No. 16/765,317, filed as application No. PCT/CN2019/094265 on Jul. 1, 2019, now Pat. No. 11,636,790.

(51) Int. Cl.
*G09G 3/3266* (2016.01)
*G09G 3/00* (2006.01)
(Continued)

(52) U.S. Cl.
CPC ............... *G09G 3/035* (2020.08); *G09G 3/20* (2013.01); *G11C 19/287* (2013.01);
(Continued)

(58) Field of Classification Search
CPC ........... G09G 3/3266; G09G 2330/028; G09G 2320/045; G09G 2320/064;
(Continued)

(56) References Cited

U.S. PATENT DOCUMENTS 11,024,258 B2  6/2021 Jeong et al.
2017/0352328 A1 12/2017 Jeong et al.
(Continued)

FOREIGN PATENT DOCUMENTS

CN    107145009 A    9/2017
CN    107452313 A    12/2017
(Continued)

OTHER PUBLICATIONS

Non-final Office Action of U.S. Appl. No. 16/765,317, dated Apr. 26, 2022.
(Continued)

*Primary Examiner* — Dennis P Joseph
(74) *Attorney, Agent, or Firm* — Chiwin Law LLC

(57) ABSTRACT

A display panel and a display drive method thereof, and a display device are provided. The display panel comprises two parallel and non-overlapping display regions connected to individual scan drive circuits. The display drive method adjusts the pulse width of the light-emitting control signal for each display regions to adjust their respective light-emitting durations within a display period. This method enhances the display quality by avoiding the appearance of a yin-yang screen and improving the display brightness of each display region.

20 Claims, 10 Drawing Sheets

(51) Int. Cl.
  *G09G 3/20* (2006.01)
  *G11C 19/28* (2006.01)
(52) U.S. Cl.
  CPC ............ *G09G 2310/0221* (2013.01); *G09G 2310/0267* (2013.01); *G09G 2310/0286* (2013.01); *G09G 2310/08* (2013.01); *G09G 2320/0233* (2013.01); *G09G 2320/045* (2013.01); *G09G 2320/048* (2013.01); *G09G 2320/064* (2013.01)
(58) Field of Classification Search
  CPC ... G09G 2310/0286; G09G 2310/0267; G09G 2310/08; G09G 2320/0233; G09G 2320/048; G11C 19/287
  See application file for complete search history.

(56) References Cited

U.S. PATENT DOCUMENTS

| | | | |
|---|---|---|---|
| 2018/0158393 A1 | 6/2018 | Woo et al. | |
| 2018/0261163 A1* | 9/2018 | Hyun | G09G 3/003 |
| 2020/0394984 A1 | 12/2020 | Park et al. | |

FOREIGN PATENT DOCUMENTS

| | | |
|---|---|---|
| CN | 107863061 A | 3/2018 |
| CN | 109584806 A | 4/2019 |
| JP | 11272205 A | 10/1999 |
| KR | 20170102148 A | 9/2017 |
| KR | 2017-013684 A | 12/2017 |
| KR | 2017-0136684 A | 12/2017 |

OTHER PUBLICATIONS

Notice of Allowance of U.S. Appl. No. 16/765,317, dated Dec. 16, 2022.
Non-final Office Action of U.S. Appl. No. 16/765,317, dated Jan. 11, 2022.
Non-final Office Action of U.S. Appl. No. 16/765,317, dated Aug. 4, 2022.
Office Communication of EP19932220.7, Feb. 17, 2023.
Office Action of KR10-2020-7037456.
International Search Report & Written Opinion of the corresponding PCT/CN2019/094256 in Chinese & English.

* cited by examiner

DISPLAY PANEL AND DISPLAY DRIVE METHOD THEREOF, AND DISPLAY DEVICE

TECHNICAL FIELD

Embodiments of the present disclosure relate to a display panel and a display drive method thereof, and a display device.

BACKGROUND

With the rapid development of electronic products, such as mobile phones, tablet computers, televisions, and the like, the display screens thereof are becoming larger and larger, because larger screens can provide users with more abundant information, improve the efficiency of human-computer communication, and bring better user experience. However, for mobile electronic products, such as mobile phones and smart watches, if the display screen is too large, the portability thereof will be seriously affected.

The above constraints may be overcome by providing a foldable display panel. Due to the advantages of light weight, small size, low power consumption, and highly portable performance, foldable display panels may have broad application prospects.

SUMMARY

At least one embodiment of the present disclosure provides a display drive method for driving a display panel, wherein the display panel comprises a plurality of display regions and a plurality of scan drive circuits, the plurality of display regions comprise a first display region and a second display region that are parallel to each other and do not overlap with each other, the plurality of scan drive circuits comprise a first scan drive circuit and a second scan drive circuit, the first display region is connected to the first scan drive circuit to receive a first light-emitting control signal provided by the first scan drive circuit, the second display region is connected to the second scan drive circuit to receive a second light-emitting control signal provided by the second scan drive circuit, and the display drive method comprises: individually adjusting a pulse width of at least one of the first light-emitting control signal and the second light-emitting control signal to adjust a light-emitting duration of light-emitting elements of the first display region and a light-emitting duration of light-emitting elements of the second display region within one display period, respectively.

For example, in the display drive method for driving the display panel provided by at least one embodiment of the present disclosure, the display panel comprises a controller, a first trigger signal line, a second trigger signal line, and clock signal lines, and the first trigger signal line, the second trigger signal line, and the clock signal lines are connected to the controller; the first scan drive circuit comprises N cascaded first shift registers, and the second scan drive circuit comprises M cascaded second shift registers; the N cascaded first shift registers and the M cascaded second shift registers are respectively connected to the clock signal lines to receive clock signals provided by the controller, a first stage of first shift register in the N cascaded first shift registers is connected to the first trigger signal line to receive a first trigger signal provided by the controller, and the first scan drive circuit outputs the first light-emitting control signal row by row through the N cascaded first shift registers in response to the first trigger signal and the clock signals, a first stage of second shift register in the M cascaded second shift registers is connected to the second trigger signal line to receive a second trigger signal provided by the controller, and the second scan drive circuit outputs the second light-emitting control signal row by row through the M cascaded second shift registers in response to the second trigger signal and the clock signals; and N and M are integers greater than 1.

For example, in the display drive method for driving the display panel provided by at least one embodiment of the present disclosure, adjusting the pulse width of the at least one of the first light-emitting control signal and the second light-emitting control signal, comprises: changing the pulse width of the at least one of the first trigger signal received by the first scan drive circuit and the second trigger signal received by the second scan drive circuit to adjust the pulse width of the at least one of the first light-emitting control signal and the second light-emitting control signal accordingly.

For example, in the display drive method for driving the display panel provided by at least one embodiment of the present disclosure, a change amount of the pulse width of the at least one of the first trigger signal received by the first scan drive circuit and the second trigger signal received by the second scan drive circuit is an integer multiple of a pulse period of the clock signals.

For example, the display drive method for driving the display panel provided by at least one embodiment of the present disclosure further comprises: in a case of outputting the first light-emitting control signal from a last stage of first shift register of the first scan drive circuit, providing the second trigger signal to a first stage of second shift register of the second scan drive circuit to drive the M cascaded second shift registers to output the second light-emitting control signal row by row.

For example, the display drive method for driving the display panel provided by at least one embodiment of the present disclosure further comprises: providing the first trigger signal to the first scan drive circuit while providing the second trigger signal to the second scan drive circuit.

For example, in the display drive method for driving the display panel provided by at least one embodiment of the present disclosure, in a case where the light-emitting duration of the light-emitting elements in the first display region in the one display period needs to be relatively increased, adjusting the pulse width of the at least one of the first light-emitting control signal and the second light-emitting control signal, comprises: increasing the pulse width of the first light-emitting control signal, or decreasing the pulse width of the second light-emitting control signal, or increasing the pulse width of the first light-emitting control signal and decreasing the pulse width of the second light-emitting control signal, so that the pulse width of the first light-emitting control signal is greater than the pulse width of the second light-emitting control signal; or in a case where the light-emitting duration of the light-emitting elements in the second display region in the one display period needs to be relatively increased, adjusting the pulse width of the at least one of the first light-emitting control signal and the second light-emitting control signal, comprises: decreasing the pulse width of the first light-emitting control signal, or increasing the pulse width of the second light-emitting control signal, or decreasing the pulse width of the first light-emitting control signal and increasing the pulse width of the second light-emitting control signal, so that the pulse width of the first light-emitting control signal is less than the pulse width of the second light-emitting control signal.

For example, the display drive method for driving the display panel provided by at least one embodiment of the present disclosure further comprises: acquiring a corresponding relation between a continuous usage duration of each of the plurality of display regions and the pulse width of the light-emitting control signal which is received; and acquiring the pulse width of the first light-emitting control signal and the pulse width of the second light-emitting control signal, which are adjusted, based on the corresponding relationship, a continuous usage duration of the first display region, and a continuous usage duration of the second display region.

For example, in the display drive method for driving the display panel provided by at least one embodiment of the present disclosure, the display panel is a foldable display panel and comprises a folding axis, the first display region and the second display region are divided along the folding axis, and the display drive method further comprises: acquiring a signal indicating a folded state of the display panel and a signal indicating a display state of the display panel, and controlling operating states of the first scan drive circuit and the second scan drive circuit based on the signal indicating the folded state and the signal indicating the display state.

For example, in the display drive method for driving the display panel provided by at least one embodiment of the present disclosure, in a case where the signal indicating the folded state of the display panel indicates that the display panel is folded such that the first display region and the second display region at least partially overlap, the display drive method further comprises: in a case where the second display region does not display, disabling the second scan drive circuit to output the second light-emitting control signal and simultaneously stopping recording a continuous usage duration of the second display region; and in a case where the second display region is used for display, enabling the second scan drive circuit to output the second light-emitting control signal, and continuously recording the continuous usage duration of the second display region.

At least one embodiment of the present disclosure provides a display panel, which comprises a plurality of display regions, a plurality of scan drive circuits, and a controller; the plurality of display regions comprise a first display region and a second display region that are parallel to each other and do not overlap with each other, the plurality of scan drive circuits comprise a first scan drive circuit and a second scan drive circuit; the controller is electrically connected to the first scan drive circuit and the second scan drive circuit to control the first scan drive circuit and the second scan drive circuit to output a first light-emitting control signal and a second light-emitting control signal, respectively; the first display region is electrically connected to the first scan drive circuit to receive the first light-emitting control signal; the second display region is electrically connected to the second scan drive circuit to receive the second light-emitting control signal; and the controller is configured to individually adjust a pulse width of at least one of the first light-emitting control signal and the second light-emitting control signal to adjust a light-emitting duration of light-emitting elements of the first display region and a light-emitting duration of light-emitting elements of the second display region within one display period, respectively.

For example, in the display panel provided by at least one embodiment of the present disclosure, the display panel comprises the controller, a first trigger signal line, a second trigger signal line, and clock signal lines, and the first trigger signal line, the second trigger signal line, and the clock signal lines are connected to the controller; the first scan drive circuit comprises N cascaded first shift registers, and the second scan drive circuit comprises M cascaded second shift registers; the N cascaded first shift registers and the M cascaded second shift registers are respectively connected to the clock signal lines to receive clock signals provided by the controller, a first stage of first shift register in the N cascaded first shift registers is connected to the first trigger signal line to receive a first trigger signal provided by the controller, and the first scan drive circuit outputs the first light-emitting control signal row by row through the N cascaded first shift registers in response to the first trigger signal and the clock signals, a first stage of second shift register in the M cascaded second shift registers is connected to the second trigger signal line to receive a second trigger signal provided by the controller, and the second scan drive circuit outputs the second light-emitting control signal row by row through the M cascaded second shift registers in response to the second trigger signal and the clock signals; and N and M are integers greater than 1.

For example, in the display panel provided by at least one embodiment of the present disclosure, a change amount of the pulse width of the at least one of the first trigger signal received by the first scan drive circuit and the second trigger signal received by the second scan drive circuit is an integer multiple of a pulse period of the clock signals.

For example, in the display panel provided by at least one embodiment of the present disclosure, the controller is further configured to provide the second trigger signal to the second scan drive circuit to output the second light-emitting control signal row by row in a case of outputting the first light-emitting control signal from a last stage of first shift register of the first scan drive circuit; or provide the first trigger signal to the first scan drive circuit while providing the second trigger signal to the second scan drive circuit.

For example, in the display panel provided by at least one embodiment of the present disclosure, the controller is further configured to enable the pulse width of the first light-emitting control signal to be greater than the pulse width of the second light-emitting control signal in a case where the light-emitting duration of the light-emitting elements in the first display region in the one display period needs to be relatively increased; and enable the pulse width of the first light-emitting control signal to be less than the pulse width of the second light-emitting control signal in a case where the light-emitting duration of the light-emitting elements in the second display region in the one display period needs to be relatively increased.

For example, in the display panel provided by at least one embodiment of the present disclosure, the first display region comprises a plurality of first pixel units arranged in an array, each of the plurality of first pixel units comprises a first pixel circuit and a first light-emitting element, the second display region comprises a plurality of second pixel units arranged in an array, and each of the plurality of second pixel units comprises a second pixel circuit and a second light-emitting element; the first pixel circuit is configured to drive the first light-emitting element, which is connected to the first pixel circuit, to emit light; and the second pixel circuit is configured to drive the second light-emitting element, which is connected to the second pixel circuit, to emit light.

For example, in the display panel provided by at least one embodiment of the present disclosure, the first pixel circuit comprises a first drive sub-circuit, a first data writing sub-circuit, a first storage sub-circuit, and a first light-emitting control sub-circuit, and the second pixel circuit comprises a second drive sub-circuit, a second data writing sub-circuit, a second storage sub-circuit, and a second light-emitting control sub-circuit; the first driving subcircuit comprises a control terminal, a first terminal, and a second terminal, and is configured to control a first drive current flowing through the first terminal and the second terminal for driving the first light-emitting element to emit light; the first data writing sub-circuit is connected to the control terminal of the first drive sub-circuit, and is configured to write a first data signal to the control terminal of the first drive sub-circuit in response to a first scan signal; the first storage sub-circuit is connected to the control terminal and the first terminal of the first drive sub-circuit, and is configured to store the first data signal written by the first data writing sub-circuit; the first light-emitting control sub-circuit is connected to the first scan drive circuit to receive the first light-emitting control signal, and is configured to apply the drive current to a first terminal of the first light-emitting element in response to the first light-emitting control signal; the second drive sub-circuit comprises a control terminal, a first terminal, and a second terminal, and is configured to control a second drive current flowing through the first terminal and the second terminal for driving the second light-emitting element to emit light; the second data writing sub-circuit is connected to the control terminal of the second drive sub-circuit, and is configured to write a second data signal to the control terminal of the second drive sub-circuit in response to a second scan signal; the second storage sub-circuit is connected to the control terminal and the first terminal of the second drive sub-circuit, and is configured to store the second data signal written by the second data writing sub-circuit; and the second light-emitting control sub-circuit is connected to the second scan drive circuit to receive the second light-emitting control signal, and is configured to apply a second voltage to the first terminal of the second drive sub-circuit in response to the second light-emitting control signal.

For example, the display panel provided by at least one embodiment of the present disclosure further comprises a folding axis; the first display region and the second display region are divided along the folding axis.

At least one embodiment of the present disclosure provides a display device, which comprises the display panel provided by any one of embodiments of the present disclosure.

BRIEF DESCRIPTION OF THE DRAWINGS

In order to clearly illustrate the technical solutions of the embodiments of the present disclosure, the drawings of the embodiments will be briefly described hereinafter. It is obvious that the described drawings are only related to some embodiments of the present disclosure and are not limitative to the present disclosure.

DETAILED DESCRIPTION

In order to make objects, technical details and advantages of the embodiments of the present disclosure apparent, the technical solutions of the embodiments will be described in a clearly and fully understandable way in connection with the drawings related to the embodiments of the present disclosure. Apparently, the described embodiments are just a part but not all of the embodiments of the present disclosure. Based on the described embodiments herein, those skilled in the art can obtain other embodiment(s), without any inventive work, which should be within the scope of the present disclosure.

Unless otherwise defined, all the technical and scientific terms used herein have the same meanings as commonly understood by one of ordinary skill in the art to which the present disclosure belongs. The terms "first," "second," etc., which are used in the present disclosure, are not intended to indicate any sequence, amount or importance, but distinguish various components. The terms "comprise," "comprising," "comprise," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may comprise an electrical connection, directly or indirectly. "On," "under," "right," "left" and the like are only used to indicate relative position relationship, and when the position of the object which is described is changed, the relative position relationship may be changed accordingly.

Hereinafter, the present disclosure will be described with reference to several specific examples. In order to keep the following description of embodiments of the present invention clear and concise, detailed descriptions of known functions and known components may be omitted. In the case where any component of an embodiment of the present invention appears in more than one drawing, the component is denoted by the same reference number in each drawing.

Figure 1:
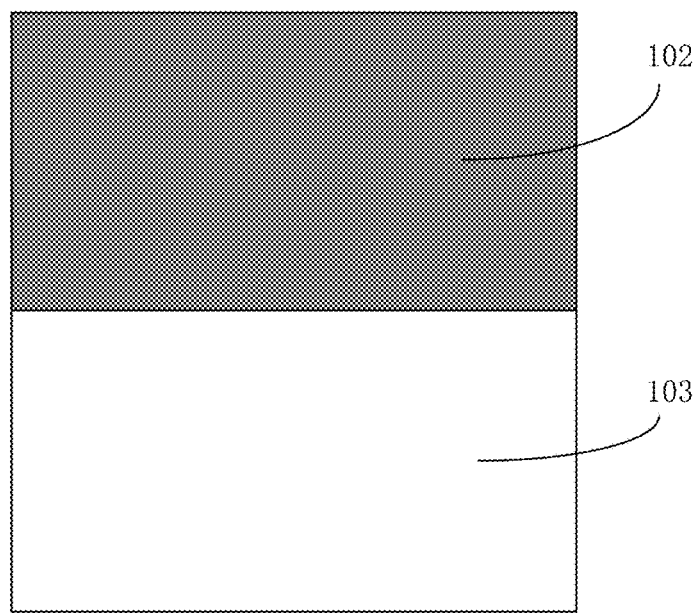
FIG. 1 shows a schematic diagram of a folding screen.

Folding screen usually means that an entire display screen is divided into at least two display regions so that users can fold and use it if necessary. FIG. 1 shows a schematic diagram of a folding screen that the entire display screen is divided into two display regions. Among them, one display region is a main screen 102 and the other display region is an auxiliary screen 103. For example, in a flattened state, the main screen 102 and the auxiliary screen 103 emit light at the same time; and in the folded state, the main screen 102 emits light while the auxiliary screen 103 does not emit light. For users who prefer to use a display screen in a folded state, the main screen 102 is in a light-emitting state for a long time, while the auxiliary screen 103 does not emit light. In this way, after a long period of accumulation, because a light-emitting duration of light-emitting elements of the main screen 102 and a light-emitting duration of light-emitting elements of the auxiliary screen 103 do not coincide, the service life (e.g., light-emitting brightness) of the light-emitting elements in the main screen 102 is much attenuated than the service life of the light-emitting elements in the auxiliary screen 103, resulting in inconsistent display brightness of the main screen 102 and the auxiliary screen 103. Therefore, in the case where the folding screen is unfolded again, that is, in the case where the main screen 102 and the auxiliary screen 103 emit light at the same time, the display brightness of the main screen 102 is lower than the display brightness of the auxiliary screen 103. For example, as shown in FIG. 1, in the case where the display screen displays a white screen, the main screen 102 and the auxiliary screen 103 appear a dark and a bright phenomenon, that is, a yin-yang screen is formed, which seriously affects the display quality of the display screen.

At least one embodiment of the present disclosure provides a display drive method of a display panel including a plurality of display regions and a plurality of scan drive circuits. the plurality of display regions comprise a first display region and a second display region that are parallel to each other and do not overlap with each other, the plurality of scan drive circuits comprise a first scan drive circuit and a second scan drive circuit, the first display region is connected to the first scan drive circuit to receive a first light-emitting control signal provided by the first scan drive circuit, the second display region is connected to the second scan drive circuit to receive a second light-emitting control signal provided by the second scan drive circuit, and the display drive method comprises: individually adjusting a pulse width of at least one of the first light-emitting control signal and the second light-emitting control signal to adjust a light-emitting duration of light-emitting elements of the first display region and a light-emitting duration of light-emitting elements of the second display region within one display period, respectively.

At least one embodiment of the present disclosure also provides a display panel and a display device corresponding to the above display drive method.

The display drive method provided by the above embodiment of the present disclosure adjusts a display brightness of the first display region and a display brightness of the second display region by adjusting pulse widths of the first light-emitting control signal and the second light-emitting control signal that control the display of the first display region and the second display region, so that the phenomenon of yin-yang screens in a display process of the display panel can be avoided, and the display quality of the display panel can be improved.

Embodiments of the present disclosure and some examples thereof are described in detail below with reference to the accompanying drawings.

At least one embodiment of the present disclosure provides a display panel. For example, the display panel is a foldable display panel and includes a folding axis. The foldable display panel according to the embodiment of the present disclosure can be folded in a variety of ways, such as by means of a flexible region, a hinge, etc. of the display panel, positions of the flexible region and the hinge correspond to the folding axis, and the embodiment of the present disclosure is not limited to the way to realize folding.

Figure 2A:
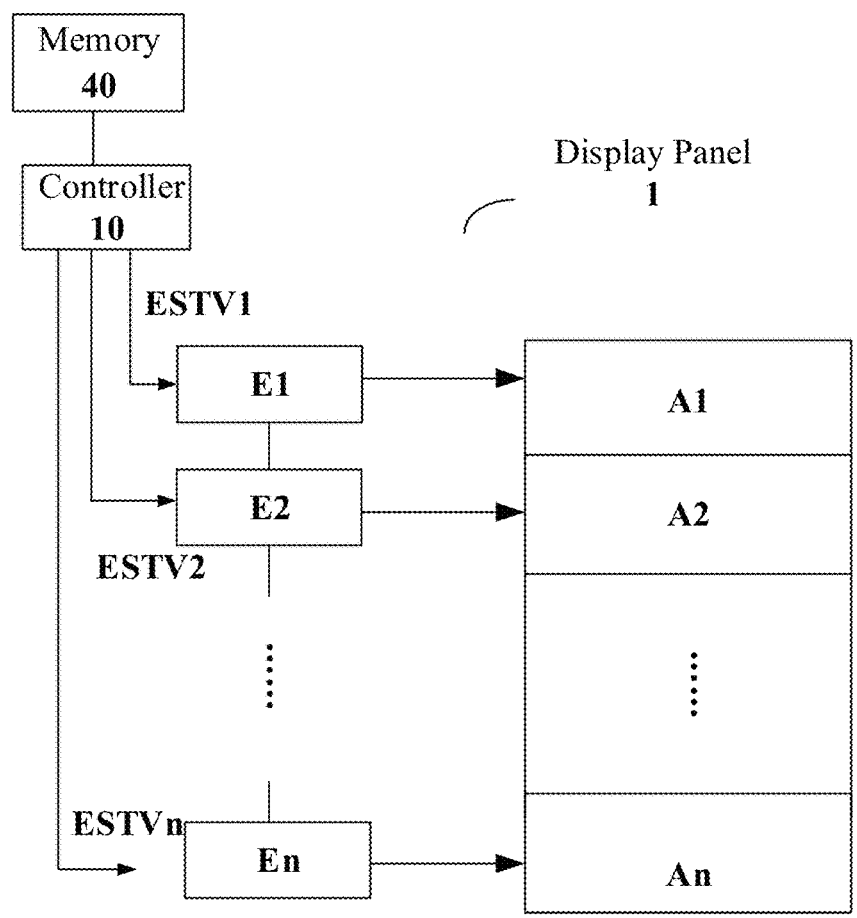
FIG. 2A is a schematic diagram of a display panel according to at least one embodiment of the present disclosure.

FIG. 2A is a schematic diagram of a display panel according to at least one embodiment of the present disclosure. As shown in FIG. 2A, the display panel 1 includes a plurality of display regions (e.g., a first display region A1, a second display region A2, . . . , an n-th display region An), a plurality of scan drive circuits (e.g., a first scan drive circuit E1, a second scan drive circuit E2, . . . , an n-th scan drive circuit En), and a controller 10. The plurality of scan drive circuits are connected to the plurality of display regions in one-to-one correspondence, respectively, so as to realize individual control for respective display regions, thereby facilitating the individual adjustment of display durations of the respective display regions, balancing the display brightness of the respective display regions of the display panel and improving the display quality of the display panel. Here, n is an integer greater than or equal to 1. For example, a display duration of a display region is a light-emitting duration of the light-emitting elements in the display region. This case can be applied to the following embodiments and will not be described again.

For example, in at least one example, the plurality of display regions include a first display region A1 and a second display region A2 that are parallel to each other and do not overlap with each other. Accordingly, the plurality of scan drive circuits include a first scan drive circuit E1 and a second scan drive circuit E2. The following description will take the display panel 1 including two display regions (the first display region A1 and the second display region A2) as an example, and the embodiment of the present disclosure is not limited thereto. It should be noted that the display drive method of the remaining display regions is similar to the display drive method of the first display region A1 and the second display region A2, and will not be described again.

Figure 2B:
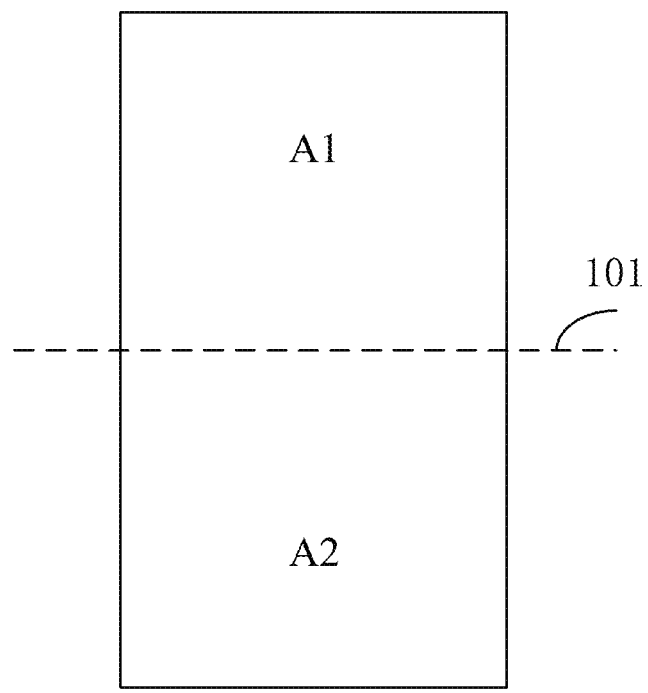
FIG. 2B is a schematic diagram illustrating only two display regions in a display panel according to at least one embodiment of the present disclosure.

FIG. 2B is a schematic diagram illustrating a display panel which includes only two display regions according to at least one embodiment of the present disclosure. For example, in the example as shown in FIG. 2B, the first display region A1 and the second display region A2 are divided along the folding axis 101. For example, the folding axis 101 is located in the middle of the display panel 1.

Figure 2C:
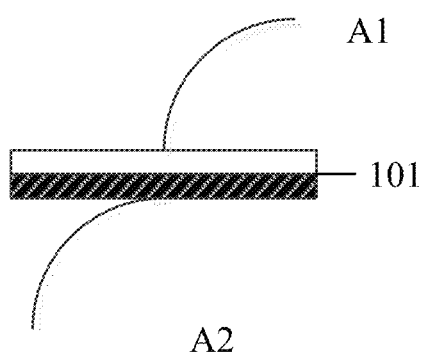
FIG. 2C is a front view of at least one example of the display panel as shown in FIG. 2B in a folded state.

FIG. 2C is a front diagram of at least one example of the display panel as shown in FIG. 2B in a folded state. For example, in the case where the display panel 1 is in a folded state, the folded state of the first display region A1 and the second display region A2 is shown in FIG. 2C. In the folded state, for example, the first display region A1 serves as a main screen for display, and the second display region A2 serves as an auxiliary screen and is located on the back side of the first display region A1. For example, in the case where the second display region A2 is used as the auxiliary screen, the second display region A2 may be used for display or may not be used for display, and its display state may be determined as required, and the embodiment of the present disclosure is not limited to this case.

It should be noted that in the case where the display panel 1 includes a plurality of display regions, correspondingly, a plurality of folding axes are also included, and the embodiments of the present disclosure are not limited thereto. For example, in the case where the display panel 1 includes three display regions (the first display region A1, the second display region A2, and the third display region A3), the display panel 1 includes two folding axes 101 and is located at, for example, ⅓ and ⅔ of the display panel, respectively. For example, a width (bending radius) of the folding axis is about 5 mm or 3 mm, and can be depended on the specific situation, and the embodiment of the present disclosure is not limited to this case.

For example, as shown in FIG. 2A, the 40 10 is respectively connected to a plurality of scan drive circuits through a plurality of trigger signal lines (a first trigger signal line ESTV1, a second trigger signal line ESTV2, and an n-th trigger signal line ESTVn) to provide trigger signals to the plurality of scan drive circuits respectively, and controls the output of corresponding light-emitting control signals to realize individual control of the plurality of scan drive circuits. For example, the controller 10 is electrically connected to the first scan drive circuit E1 and the second scan drive circuit E2 by the first trigger signal line ESTV1 and the second trigger signal line ESTV2, respectively, to control the first scan drive circuit E1 and the second scan drive circuit E2 to output the first light-emitting control signal and the second light-emitting control signal, respectively.

Figure 3:
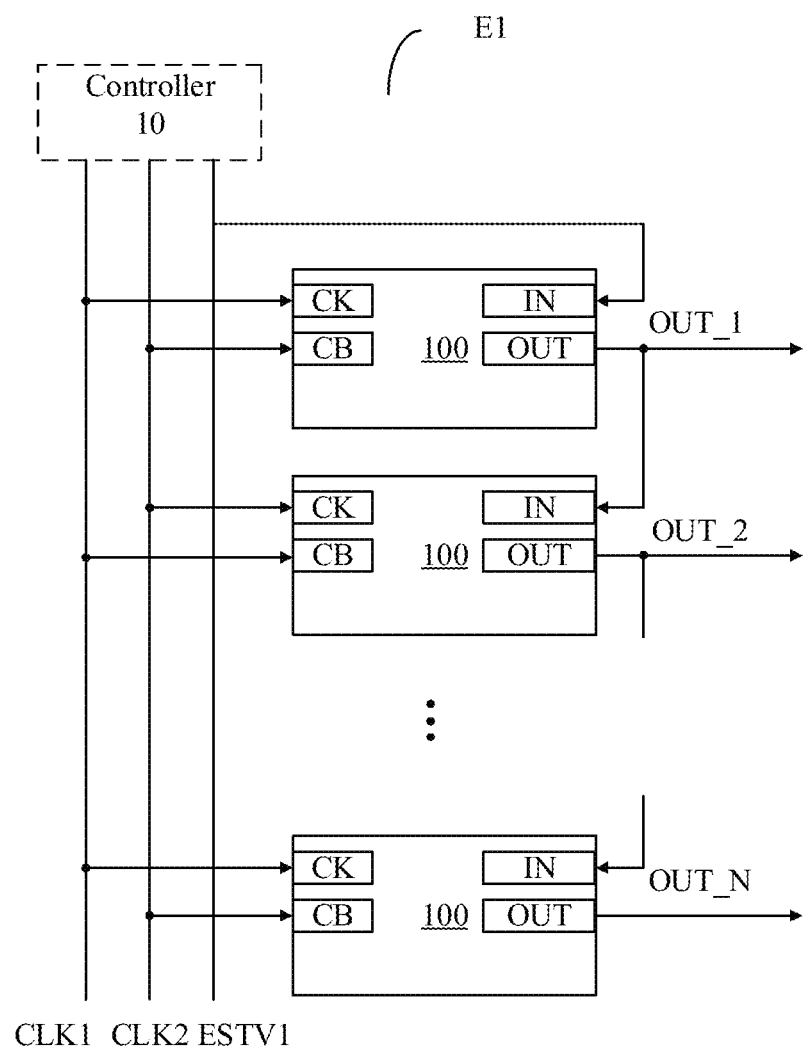
FIG. 3 is a circuit structure schematic diagram of at least one example of the first scan drive circuit as shown in FIG. 2A or FIG. 2D.
Figure 4A:
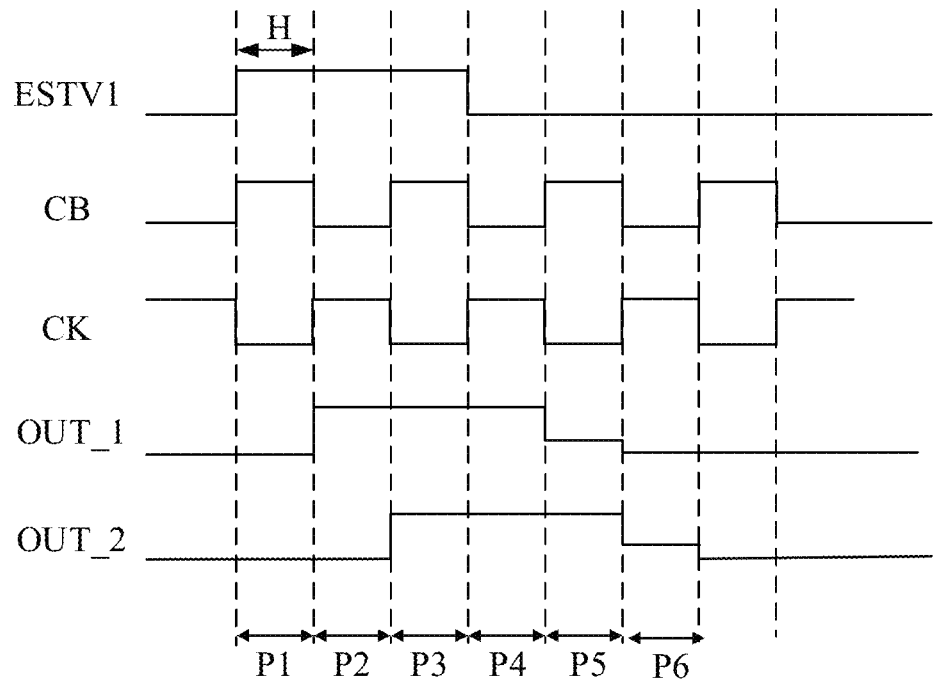
FIG. 4A is a signal timing diagram of the first scan drive circuit as shown in FIG. 3.

For example, as shown in FIG. 3, the first scan drive circuit E1 includes N (N is an integer greater than 1) cascaded first shift registers, and the second scan drive circuit E2 includes M (M is an integer greater than 1) cascaded second shift registers. A first stage of shift register in the N cascaded first shift registers receives the first trigger signal provided by the first trigger signal line ESTV1, so that the first scan drive circuit E1 is configured to output the first light-emitting control signal row by row through the N cascaded first shift registers in response to the first trigger signal; and a first stage of shift register in the M cascaded second shift registers receives the second trigger signal provided by the second trigger signal line ESTV2, so that the second scan drive circuit E2 is configured to output the second light-emitting control signal row by row through the M cascaded second shift registers in response to the second trigger signal. It should be noted that the specific control method is shown in FIGS. 3-5 and will be described in detail below, which will not be repeated here.

Figure 6:
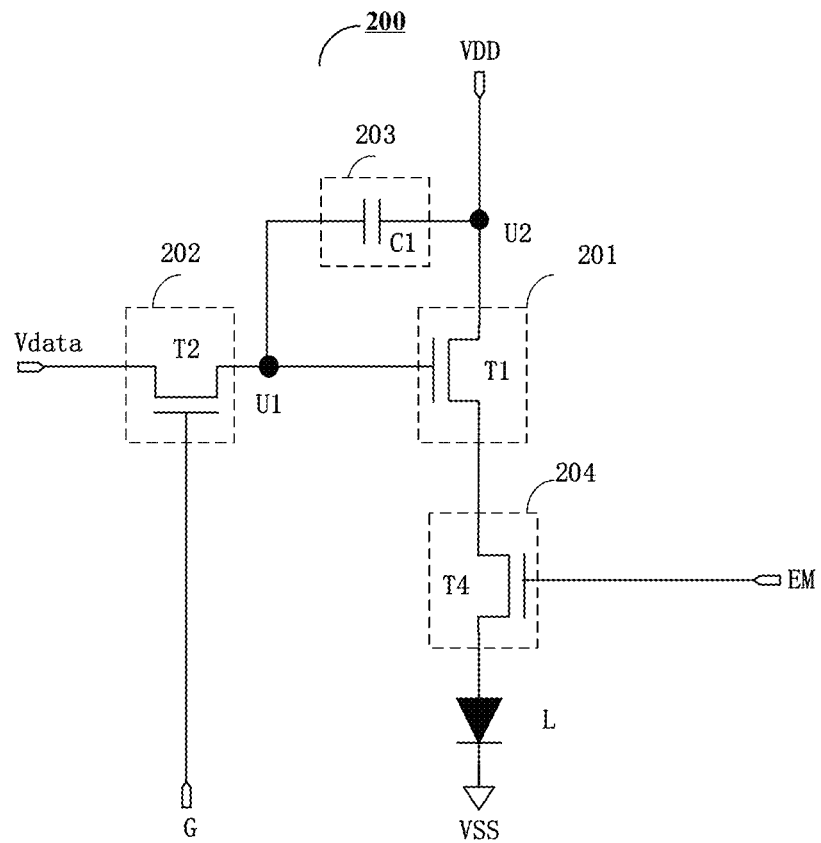
FIG. 6 is a circuit structure diagram of at least one example of a first pixel circuit in the pixel unit as shown in FIG. 2D.
Figure 7:
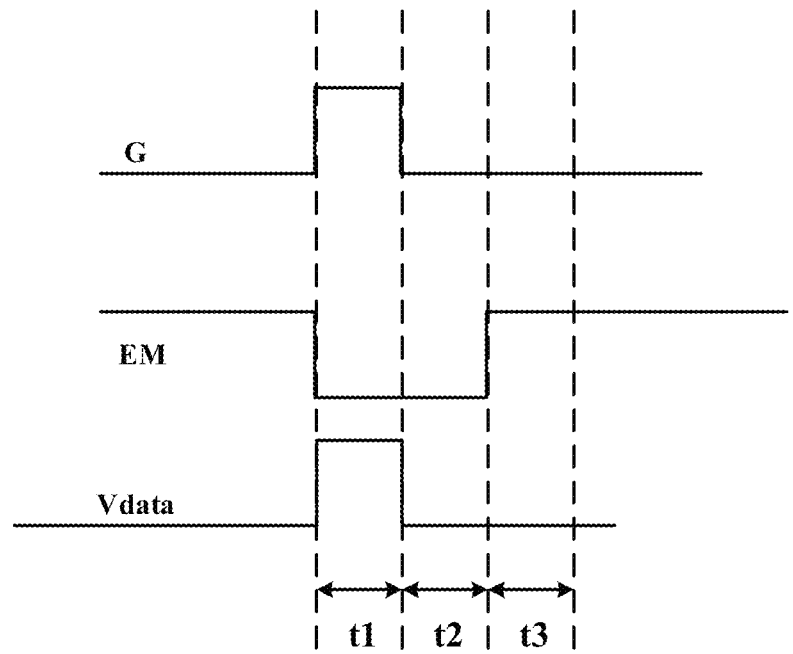
FIG. 7 is a signal timing diagram in a case where the first pixel circuit as shown in FIG. 6 is in operation.

For example, the first display region A1 is electrically connected to the first scan drive circuit E1 to receive the first light-emitting control signal, so that respective sub-pixels in the first display region A1 emit light under control of the first light-emitting control signal; and the second display region A2 is electrically connected to the second scan drive circuit E2 to receive the second light-emitting control signal, so that respective sub-pixels in the second display region A2 emit light under control of the second light-emitting control signal. The specific control method is shown in FIGS. 6 and 7, which will be described in detail below and will not be described here.

As described above, because respective display regions emit light under the control of emission control signals, which is received, output by the scan drive circuits, the emission control signals of the respective scan drive circuits are related to the trigger signals provided by the controller 10, the controller 10 may be configured to adjust a pulse width of at least one of the first emission control signal and the second emission control signal, to adjust a display duration of each of the first display region A1 and the second display region A2 in one display period, respectively, so that display durations of respective the first display region A1 and the second display region A2 in one display period is the same or substantially the same. For example, one display period of each display region represents a scan period of one frame of image. For example, the display duration of the display region is the same as a duration corresponding to the pulse width of the light-emitting control signal.

Figure 8:
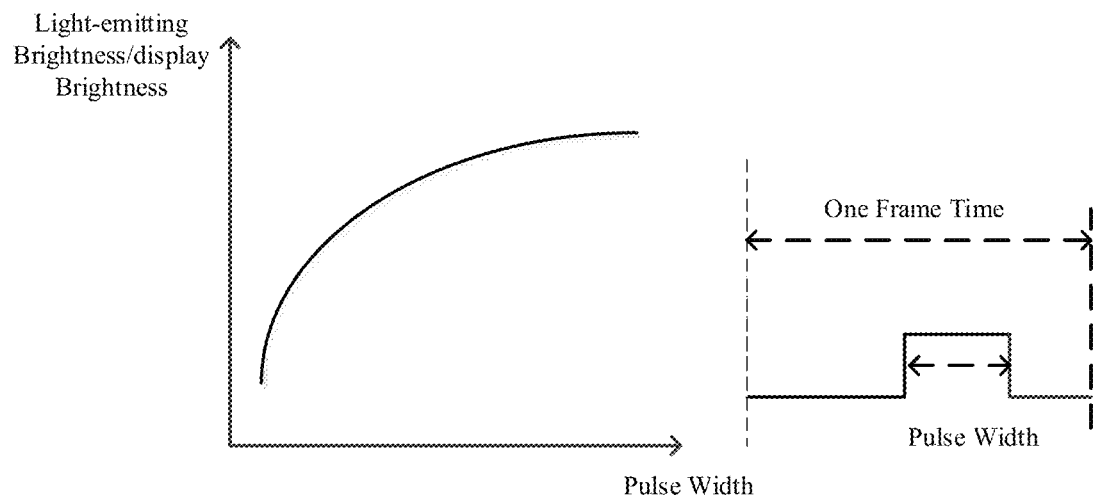
FIG. 8 is a graph illustrating a display brightness of a display region and pulse width of a light-emitting control signal according to at least one embodiment of the present disclosure.

Again, because the display duration of each display region is related to the display brightness of each display region, for example, as shown in FIG. 8, the display brightness of the display region gradually increases as the display duration of the display region increases. Therefore, the display brightness of the first display region A1 and the second display region A2 can be adjusted by adjusting the display duration of each of the first display region A1 and the second display region A2 in one display period, so that the display brightness of each display region of the display panel reaches balance within a visible range of human eyes, thereby avoiding the appearance of yin-yang screen and improving the display quality of the display panel. For example, the display brightness of the display region proposed in the embodiment of the present disclosure may represent the display brightness of the display region, of which all sub-pixels display a same gray scale.

For example, the controller 10 may be an application specific integrated circuit chip, a general purpose integrated circuit chip, for example, may be implemented as a central processing unit (CPU), a field programmable gate array (FPGA), or other form of processing unit having data processing capability and/or instruction execution capability, and the embodiments of the present disclosure are not limited thereto, for example, the controller 10 may be implemented as a timing controller (T-con). For example, the controller 10 includes a clock generation circuit or is coupled to an independently provided clock generation circuit the independently provided clock generation circuit is used for generating a clock signal, and the pulse width of the clock signal can be adjusted if necessary, whereby the clock signal can be used for generating trigger signals ESTV1, ESTV2, etc. The embodiments of the present disclosure are not limited to the type and configuration of the clock generation circuit.

Figure 2D:
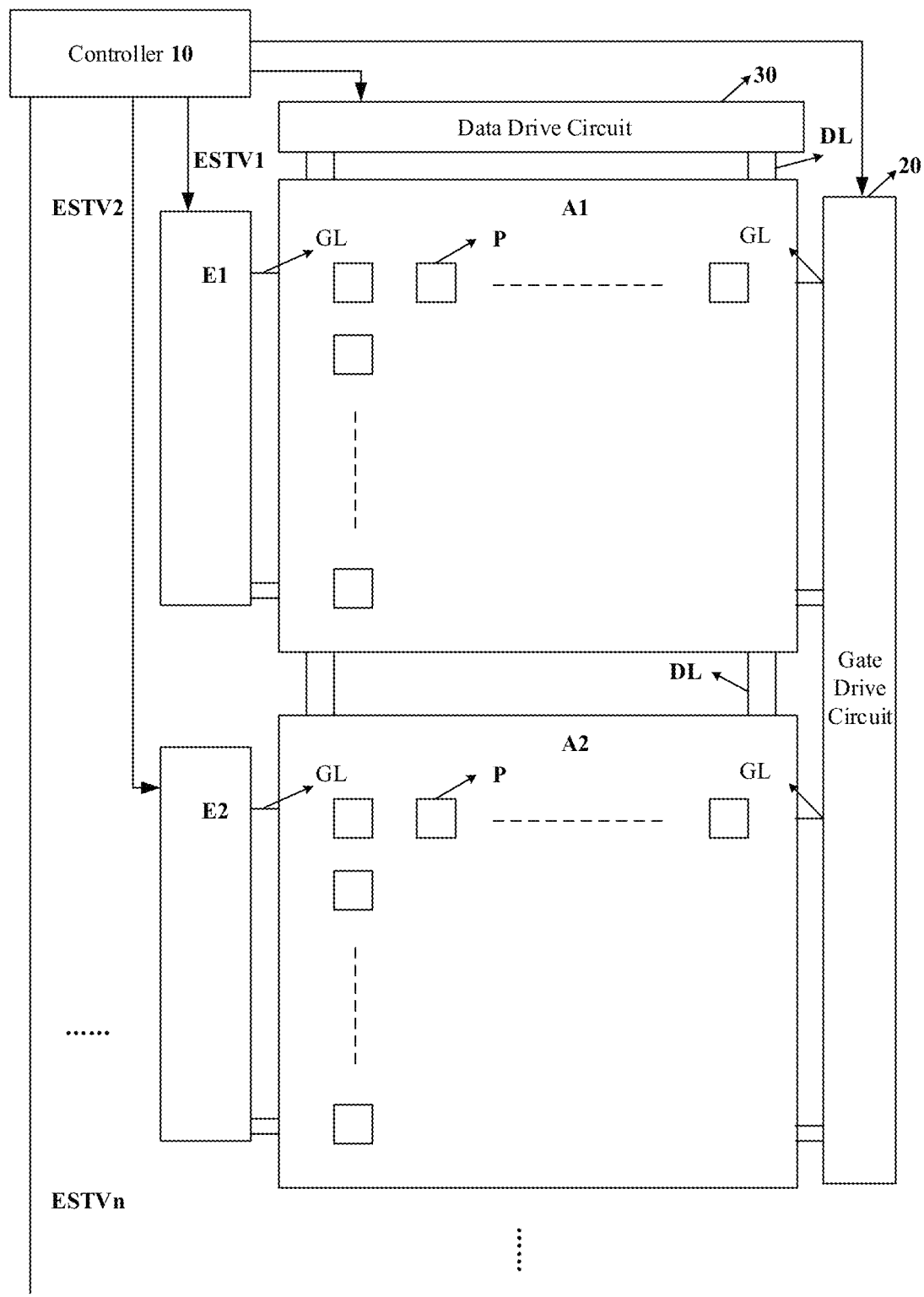
FIG. 2D shows a diagram in which a plurality of display regions are connected with a plurality of scan drive circuits according to at least one embodiment of the present disclosure.

The following description will take the controller 10 controlling the first scan drive circuit E1 to output the first light-emitting control signal as an example. FIG. 2D shows a specific connection schematic diagram of a plurality of display regions and a plurality of scan drive circuits according to at least one embodiment of the present disclosure. For example, as shown in FIG. 2D, each display region includes a plurality of pixel units arranged in an array. For example, the first display region A1 includes a plurality of first pixel units P arranged in an array, and each of the plurality of first pixel units P includes a first pixel circuit and a first light-emitting element; the second display region A2 includes a plurality of second pixel units arranged in an array, and each of the plurality of second pixel units includes a second pixel circuit and a second light-emitting element. It should be noted that FIG. 2D schematically shows the connection relationship of the two display regions, but the embodiment of the present disclosure is not limited to this case, and the connection relation of other display regions may refer to the connection relation of the two display regions, which will not be described here.

For example, the display panel 1 may further include a data drive circuit 30 and a gate drive circuit 20. For example, the gate drive circuit 20 may include a plurality or one, and is sequentially connected to respective rows of pixel units sequentially arranged in each display region through gate lines which are sequentially arranged, respectively. The gate drive circuit 20 is mainly used for controlling to write data signals provided by the data drive circuit 30 into the pixel circuits of the pixel units. The scan drive circuit is mainly used for controlling the light-emitting of the light-emitting elements driven by the pixel circuits.

For example, the data drive circuit 30 is electrically connected to the pixel units P of the plurality of display regions through data lines DL, and is used for providing data signals to the pixel array, for example, the same column of pixel units located in different display regions are connected to the same data line DL; and the gate drive circuit 10 is electrically connected to respective rows of pixel units P of respective display regions through the gate lines GL, and is used to provide a scan signal to the pixel array. For example, the scan signal may drive a data writing transistor (T2 in FIG. 6) in the pixel units P.

For example, the first scan drive circuit E1 is used to provide the first light-emitting control signal to light-emitting control transistors (such as transistor T4 in FIG. 6) in respective rows of first pixel units P of the first display region A1 to control the first light-emitting elements in the first pixel unit P to emit light, the second scan drive circuit E2 is used to provide the second light-emitting control signal to light-emitting control transistors in respective rows of second pixel units P of the second display region A2, to control the second light-emitting elements in the second pixel unit P to emit light, the connection mode of the remaining scan drive circuits with the pixel units in the respective display regions is similar to the connection mode of the first scan drive circuit E1 or the second scan drive circuit E2, and will not be repeated here again For example, the controller 10 is connected to the plurality of scan drive circuits in one-to-one correspondence through the first trigger signal line ESTV1 and the second trigger signal line ESTV2, and the n-th trigger signal line ESTVn to provide trigger signals to control respective scan drive circuits to output light-emitting control signals, respectively. The controller 10 is also electrically connected to the data drive circuit 30 and the gate drive circuit 20 to control the data drive circuit 30 and the gate drive circuit 20 to output data signals and scan signals, respectively.

For example, the gate drive circuit 20 and the data drive circuit 30 may adopt those gate drive circuits and data drive circuits used in the art, and will not be described here again. The circuit structure and operating principle of the first scan drive circuit and the first pixel circuit included in the pixel unit P will be described in detail below.

FIG. 3 is a circuit structure schematic diagram of at least one example of the first scan drive circuit as shown in FIG. 2A or FIG. 2D. As shown in FIG. 3, the first scan drive circuit E1 includes the N cascaded first shift registers 100, and clock signal lines (e.g., a first clock signal line CLK1 and a second clock signal line CLK2) and the first trigger signal line ESTV1 respectively connected to the N cascaded first shift registers 100 to receive clock signals (e.g., a first clock signal and a second clock signal) and the first trigger signal. For example, a first stage of first shift register in the N cascaded first shift registers 100 is connected to the first trigger signal line ESTV1 to receive the first trigger signal, and the first scan drive circuit 20 is configured to output the first light-emitting control signal row by row through the N cascaded first shift registers in response to the first trigger signal. For example, as shown in FIG. 4A, after an output terminal OUT_1 of the first stage of first shift register outputs the first light-emitting control signal, an output terminal OUT_2 of a second stage of first shift register outputs the first light-emitting control signal, and so on.

It should be noted that in the case where the display panel includes a plurality of scan drive circuits, the display panel also includes a plurality of trigger signal lines, and the plurality of scan drive circuits are connected to the plurality of trigger signal lines in a one-to-one corresponding manner, thereby realizing the individual control of the respective scan drive circuits. For example, the second scan drive circuit is connected to the second trigger signal line to receive the second trigger signal. For example, all of the plurality of trigger signal lines can extend along the display region of the entire display panel (e.g., lengths of the plurality of trigger signal lines are the same), so as to avoid different trace resistances caused by different trace lengths of trigger signal lines corresponding to the respective display regions, thereby avoiding to affect the accuracy of the trigger signal and ensuring the display accuracy of the display panel.

For example, the plurality of scan drive circuits may share the first clock signal line CLK1 and the second clock signal line CLK2, or may be provided separately, so long as the normal operation of the respective scan drive circuits is not affected, the embodiment of the present disclosure is not limited to this case.

Because the first clock signal line CLK1, the second clock signal line CLK2, and the first trigger signal line ESTV1 of the first scan drive circuit E1 are connected to the controller 10 to receive the first clock signal CK, the second clock signal CB, and the first trigger signal ESTV, the controller 10 can control the first scan drive circuit E1 to output the first light-emitting control signal.

FIG. 5 is a schematic diagram of a specific circuit structure of at least one example of the first shift register as shown in FIG. 3. For example, each stage of first shift register 100 may adopt the circuit structure as shown in FIG. 5.

As shown in FIG. 5, the first shift register 100 includes ten (10) transistors (first transistor M1, second transistor M2, . . . , tenth transistor M10) and 3 capacitors (first capacitor C1, second capacitor C2, and third capacitor C3). For example, in the case where the plurality of first shift registers 100 are cascaded, a first electrode of the first transistor M1 in the first stage of shift register 100 is configured to be connected to the first trigger signal line ESTV1 to receive the first trigger signal ESTV1, while the first electrode of the first transistor M1 in the other stages of the first shift register 100 is connected to a previous stage of first shift register 100 to receive the first light-emitting control signal EM output from the previous stage of first shift register 100. In addition, CK in FIGS. 5 and 4A represents the first clock signal provided by the first clock signal line CLK1, and CB represents the second clock signal provided by the second clock signal line CLK2. For example, the first clock signal CK and the second clock signal CB may adopt pulse signals with duty ratios greater than 50%. VGH represents a third voltage, for example, the third voltage is a DC high level, VGL represents a fourth voltage, for example, the fourth voltage is a DC low level, and the third voltage is greater than the fourth voltage. N1, N2, N3, and N4 represent a first node, a second node, a third node, and a fourth node, respectively. The connection relationship between respective transistors and respective capacitor in FIG. 5 can be shown in FIG. 5 and will not be described here again.

The transistors in the first shift register 100 as shown in FIG. 5 are all described by taking P-type transistors as an example, that is, each transistor is turned on in the case where a gate electrode receives a low level and turned off in the case where the gate electrode receives a high level. At this time, the first electrode may be a source electrode and the second electrode may be a drain electrode. The embodiment of the present disclosure includes, but is not limited to, the configuration of FIG. 5. For example, the respective transistor in the first shift register 100 can also adopt N-type transistors or a mixture of P-type transistors and N-type transistors, and only port polarities of selected types of transistors need to be connected correspondingly according to the port polarities of the corresponding transistors in the embodiment of the present disclosure.

FIG. 4A is a signal timing diagram of the first scan drive circuit as shown in FIG. 3. The operation process of the first scan drive circuit provided in at least one embodiment of the present disclosure will be described in detail below with reference to FIGS. 3-5. For example, the working principles of the first stage of first shift register 100 and a second stage of first shift register 100 in the first scan drive circuit E1 are described, and the working principles of the other stages of the first shift register 100 are similar to those of the first shift register 100 and will not be described again. As shown in FIG. 4A, there are six phases, namely, a first phase P1, a second phase P2, a third phase P3, a fourth phase P4, a fifth phase P5, and a sixth phase P6. FIG. 4A shows the timing waveform of respective signals in respective phases.

In the first phase P1, as shown in FIG. 4A, the first clock signal CK is at a low level, and thus the first transistor M1 and a third transistor M3 are turned on. The turn-on first transistor M1 transmits the high-level first trigger signal ESTV1 to the first node N1 so that the level of the first node N1 becomes a high level, and thus, the second transistor M2, an eighth transistor M8, and the tenth transistor M10 are turned off. In addition, the turn-on third transistor M3 transfers the fourth voltage VGL of low level to the second node N2, so that a level of the second node N2 becomes a low level, so that a fifth transistor M5 and a sixth transistor M6 are turned on. Since the second clock signal CB is at a high level, a seventh transistor M7 is turned off. In addition, due to the storage effect of the third capacitor C3, a level of the fourth node N4 can be kept at a high level, thereby turning off a ninth transistor M9. In the first phase P1, because both the ninth transistor M9 and the tenth transistor M10 are turned off, the first light-emitting control signal EM output from the output terminal OUT_1 of the first shift register 100 maintains at a previous low level.

In the second phase P2, as shown in FIG. 4A, the second clock signal CB is at a low level, so the fourth transistor M4 and the seventh transistor M7 are turned on. Because the first clock signal CK is at a high level, the first transistor M1 and the third transistor M3 are turned off. Due to the storage effect of the first capacitor C1, the second node N2 can continue to maintain the low level of the previous phase, so the fifth transistor M5 and the sixth transistor M6 are turned on. The high-level third voltage VGH is transmitted to the first node N1 through the turn-on fifth transistor M5 and fourth transistor M4, so that a level of the first node N1 continues to maintain the high level of the previous phase, so that the second transistor M2, the eighth transistor M8, and the tenth transistor M10 are turned off. In addition, the low-level second clock signal CB is transmitted to the fourth node N4 through the turn-on sixth transistor M6 and the seventh transistor M7, so that the level of the fourth node N4 becomes a low level. Therefore, the ninth transistor M9 is turned on, and the turn-on ninth transistor M9 outputs the high-level third voltage VGH. Therefore, the first light-emitting control signal EM output by the output terminal OUT_1 of the first shift register 100 in the second phase P2 is at a high level.

In the third phase P3, as shown in FIG. 4A, the first clock signal CK is at a low level, so the first transistor M1 and the third transistor M3 are turned on. The second clock signal CB is at a high level, so the fourth transistor M4 and the seventh transistor M7 are turned off. Due to the storage effect of the third capacitor C3, the level of the fourth node N4 can be kept at the low level of the previous phase, so that the ninth transistor M9 is kept in a turn-on state, and the turn-on ninth transistor M9 outputs the high-level third voltage VGH, so that the light-emitting control signal EM output by the output terminal OUT_1 of the first shift register 100 at the third phase P3 is still at a high level. Meanwhile, in this phase, the output terminal OUT_2 of the second stage of first shift register 100 outputs a high level (reference may be made to the operation process of the first stage of first shift register in the above-mentioned second phase P2 for detailed description).

In the fourth phase P4, as shown in FIG. 4A, the first clock signal CK is at a high level, so the first transistor M1 and the third transistor M3 are turned off. The second clock signal CB is at a low level, so the fourth transistor M4 and the seventh transistor M7 are turned on. Due to the storage effect of the second capacitor C2, the level of the first node N1 remains at the high level of the previous phase, so that the second transistor M2, the eighth transistor M8, and the tenth transistor M10 are turned off. Due to the storage effect of the first capacitor C1, the second node N2 continues to maintain at the low level of the previous phase, so that the fifth transistor M5 and the sixth transistor M6 are turned on. In addition, the low-level second clock signal CB is transmitted to the fourth node N4 through the turn-on sixth transistor M6 and the seventh transistor M7, so that the level of the fourth node N4 becomes at a low level. Therefore, the ninth transistor M9 is turned on, and the turn-on ninth transistor M9 outputs the high-level third voltage VGH. Therefore, the first light-emitting control signal EM output by the output terminal OUT_1 of the first shift register 100 in the second phase P2 is still at a high level. Meanwhile, in this phase, the output terminal OUT_2 of the second stage of first shift register 100 outputs a high level (reference may be made to the operation process of the first stage of first shift register in the above-mentioned third phase P3 for detailed description).

In the fifth phase P5, as shown in FIG. 4A, the first clock signal CK is at a low level, so the first transistor M1 and the third transistor M3 are turned on. The second clock signal CB is at a high level, so the fourth transistor M4 and the seventh transistor M7 are turned off. The turn-on first transistor M1 transmits a low-level first trigger signal ESTV1 to the first node N1 so that the level of the first node N1 becomes at a low level. For example, in the fifth phase P5, the low-level voltage of the first clock signal CK is −6V, the low-level voltage of the first trigger signal is −6V, and a threshold voltage Vth of the first transistor M1 is −1.5V. Because the first transistor M1 is a P-type transistor, in order to turn on the first transistor M1, it is necessary to enable the voltage Vgs between the gate electode and the source electrode of the first transistor M1 to be less than the threshold voltage Vth of the first transistor M1. Therefore, charging is stopped in the case where the first node N1 is charged to −4.5V, that is, the low-level voltage of the first node N1 is −4.5V in this phase, so the second transistor M2, the eighth transistor M8, and the tenth transistor M10 are turned on. The turn-on second transistor M2 transmits the low-level first clock signal CK to the second node N2, so that the level of the second node N2 can be further pulled down, so the second node N2 continues to maintain at the low level of the previous phase, thereby causing the fifth transistor M5 and the sixth transistor M6 to be turned on. In addition, the turn-on eighth transistor M8 transmits the high-level third voltage VGH to the fourth node N4, causing the level of the fourth node N4 to become at a high level, so the ninth transistor M9 is turned off. The turn-on tenth transistor M10 outputs a low-level fourth voltage VGL (e.g., −6V) in response to a low level (e.g., −4.5V) of the first node N1. Similarly, the threshold voltage Vth of the tenth transistor M10 is-1.5V. In order to turn on the tenth transistor M10, it is necessary to enable the voltage Vgs between a gate electrode and a source electrode of the tenth transistor M10 less than a threshold voltage Vth of the tenth transistor M10. Therefore, in the case where the voltage output from the output terminal OUT is −3V, the tenth transistor M10 is turned off, that is, the low-level voltage at the low level of the output terminal OUT in this phase is −3V, so the light-emitting control signal EM output from the output terminal OUT_1 of the first shift register 100 at the fifth phase P5 becomes at a first low level (for example, −3V). Meanwhile, in this phase, the output terminal OUT_2 of the second stage of first shift register 100 outputs a high level (for detailed description, please refer to the operation process of the first stage of first shift register in the above-mentioned fourth phase P4).

In the sixth phase P6, as shown in FIG. 4A, the first clock signal CK is at a high level and the second clock signal CB is at a low level, so the fourth transistor M4 and the seventh transistor M7 are turned on. Because the second clock signal CB changes from the high level of the fifth phase P5 to a low level, for example, a change amount is Δt (for example, greater than 6V), according to the bootstrap effect of the second capacitor C2, the level of the first node N1 changes from the low level of the fifth phase P5 (for example, −4.5V) to a lower low level (for example, −4.5V-Δt), so that the second transistor M2 and the tenth transistor M10 are turned on under control of the low level of the first node N1 (for example, −4.5-Δt), according to the turn-on characteristics of the tenth transistor M10 described above, the low-level fourth voltage VGL (e.g., −6V) can be completely output to the output terminal OUT. For example, in the sixth phase P6, the voltage output from the output terminal OUT is a second low level (e.g., −6V). Meanwhile, in this phase, the output terminal OUT_2 of the second stage of first shift register 100 outputs a low level (e.g., −3V, please refer to the operation process of the first stage of first shift register in the above-mentioned fourth phase P4 for detailed description).

As described above, the pulse width of the first light-emitting control signal EM output by each stage of first shift register 100 is related to a pulse width of the first trigger signal ESTV1, for example, the pulse width of the first light-emitting control signal EM is related to the pulse width of the first trigger signal ESTV1, for example, the pulse width of the first light-emitting control signal EM is the same as the pulse width of the first trigger signal ESTV1, or the pulse width of the first light-emitting control signal EM is proportional to the pulse width of the first trigger signal ESTV1. For example, in the case where the pulse width of the first trigger signal ESTV1 is 3 H or 4 H, the pulse width of the first light-emitting control signal EM is 3 H, and in the case where the pulse width of the first trigger signal ESTV1 is 5 H or 6 H, the pulse width of the first light-emitting control signal EM is 5 H. Therefore, by adjusting the pulse width of the first trigger signal ESTV1 received by the first scan drive circuit and the pulse width of the first light-emitting control signal EM output by the first shift register 100, the light-emitting duration of the corresponding pixel unit P can be adjusted, and then the display duration, that is, the display brightness, of the first display region A1 can be adjusted.

Accordingly, the pulse width of the second light-emitting control signal is also related to a pulse width of the second trigger signal, for example, the pulse width of the second light-emitting control signal EM is the same as the pulse width of the second trigger signal ESTV2, or the pulse width of the second light-emitting control signal EM is proportional to the pulse width of the second trigger signal ESTV2. In the case where the display panel includes a plurality of scan drive circuits, the controller 10 can adjust the pulse width of the light-emitting control signal output by each scan drive circuit by adjusting the pulse width of the trigger signal received by each scan drive circuit, thereby realizing the adjustment of the display duration of each display region and the adjustment of the display brightness of each display region.

It should be noted that the corresponding relationship between the pulse width of the light-emitting control signal and the pulse width of the trigger signal corresponding to the rest of the scan drive circuits can refer to the corresponding relationship between the pulse width of the first light-emitting control signal EM and the pulse width of the first trigger signal ESTV1, and will not be described again.

It should be noted that a change amount of the pulse width of the at least one of the first trigger signal received by the first scan drive circuit and the second trigger signal received by the second scan drive circuit is an integer multiple of a pulse period of the clock signal. For example, as shown in FIG. 4A, the pulse period of the clock signal is 2 H. In the case where the pulse width of the first light-emitting control signal EM or the second light-emitting control signal EM needs to be changed, the pulse width of the first trigger signal ESTV1 or the second trigger signal ESTV2 can be increased by an integer multiple 2 H, 4 H, etc. of the pulse period of the clock signals on the basis of the existing width.

Figure 4B:
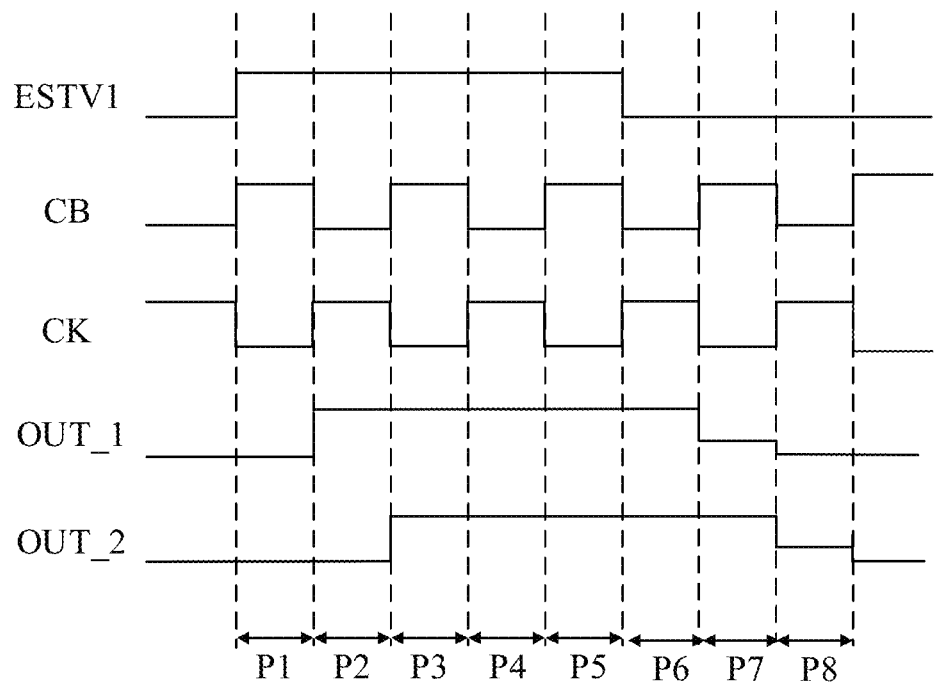
FIG. 4B is a timing diagram for adjusting a pulse width of a first trigger signal based on the signal timing as shown in FIG. 4A.
Figure 5:
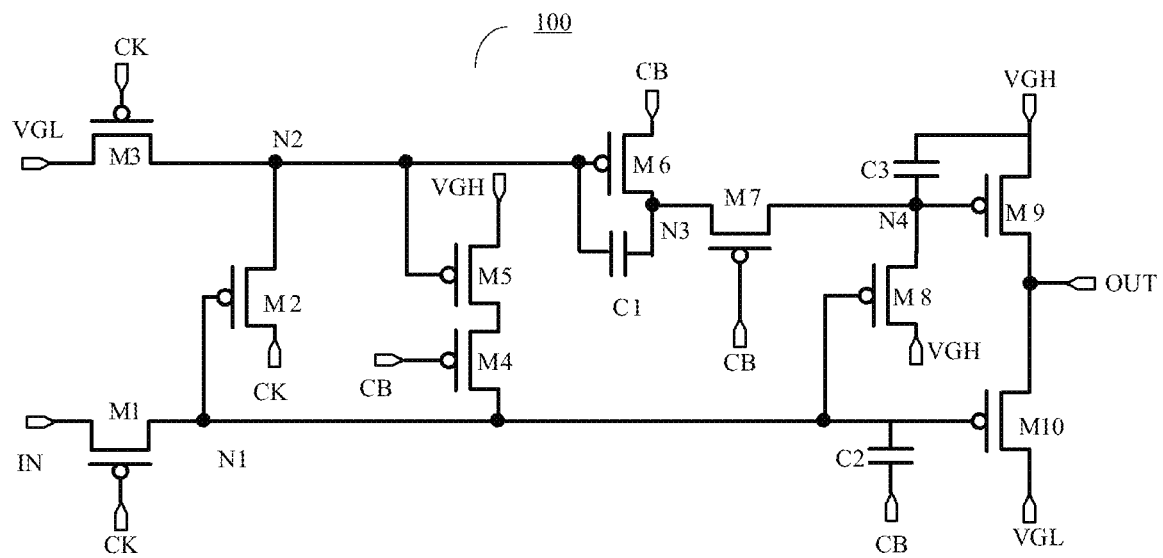
FIG. 5 is a circuit structure diagram of at least one example of the first shift register as shown in FIG. 3.

FIG. 4B is a timing diagram for adjusting the pulse width of the first trigger signal based on the signal timing as shown in FIG. 4A. As shown in FIG. 4B, in the case where the pulse width of the first trigger signal ESTV1 changes from 3 H as shown in FIG. 4A to 5H as shown in FIG. 4B, the pulse width of the first light-emitting control signal correspondingly changes to 5 H, so that the pulse width of the first light-emitting control signal EM output by the first scan drive circuit can be adjusted by adjusting the pulse width of the first trigger signal ESTV1 received by the first scan drive circuit.

It should be noted that the operation principle of the shift register in the first phase P1 to the fourth phase P4 as shown in FIG. 4B can be described with reference to the operation principle of the shift register in the first phase P1 to the fourth phase P4 as shown in FIG. 4A. Compared with the shift register in FIG. 4A, the operating principles of the shift register in the added fifth phase P5 and the sixth phase P6 as shown in FIG. 4B can refer to the above-mentioned description of the operating principles of the shift register in the third phase P3 and the fourth phase P4 as shown in FIG. 4A, and the operation principle of the shift register in a seventh phase P7 to an eighth phase P8 shown in FIG. 4B can refer to the description of the operation principle of the shift register in the fifth phase P5 and the sixth phase P6 as shown in FIG. 4A, which will not be repeated herein again.

It should be noted that the circuit structure of each shift register unit in the first scan drive circuit E1 is not limited to the circuit structure as shown in FIG. 5, but may also be other circuit structures capable of realizing shift output of the first light-emitting control signal in the Art. The embodiment of the present disclosure is not limited to this case.

It should be noted that the second scan drive circuit E2 or the scan drive circuit connected to other display regions may adopt the same circuit structure as the first scan drive circuit E1 or may adopt different circuit structures, so long as the output of the second light-emitting control signal satisfying the requirements can be realized, and the embodiment of the present disclosure is not limited to this case. It should be noted that the following description will take a case that the second scan drive circuit E2 and the first scan drive circuit E1 adopt the similar circuit structure as an example. The specific working principle of the second scan drive circuit E2 outputting the second light-emitting control signal is similar to the specific working principle of the first scan drive circuit. For details, please refer to the working mode of the first scan drive circuit E1 and will not be repeated herein again.

For example, in order to ensure the normal operation of the display panel, in the case where a last stage of first shift register of the first scan drive circuit E1 outputs the first light-emitting control signal, the controller 10 provides the second trigger signal to a first stage of the second scan drive circuit E2 to drive the M cascaded second shift registers to output the second light-emitting control signal row by row, and so on, in the case where the display panel includes a plurality of scan drive circuits.

FIG. 6 is a circuit structure diagram of at least one example of a first pixel circuit in the pixel unit as shown in FIG. 2D; FIG. 7 is a signal timing diagram in the case where the first pixel circuit shown in FIG. bis in operation. The operation principle of the first pixel circuit will be described below with reference to FIGS. 6 and 7. The transistors as shown in FIG. 6 are all described by taking N-type transistors as an example, i.e., each transistor is turned off in the case where a gate electrode receives a low level, and turned on in the case where the gate electrode receives a high level. It should be noted that the transistors as shown in FIG. 6 can also be all replaced by P-type transistors. Accordingly, the timing of the signal timing diagram as shown in FIG. 7 indicating the high-low level is opposite to the high-low level in the present timing. The specific operation process is similar to that of the N-type transistor, and will not be repeated herein again.

In the example as shown in FIG. 6, the first pixel circuit 200 includes a first drive sub-circuit 201, a first data writing sub-circuit 202, a first storage sub-circuit 203, and a first light-emitting control sub-circuit 204.

The first drive sub-circuit 201 includes a control terminal (first pixel node U1), a first terminal (second pixel node U2), and a second terminal (connected to the first light-emitting control sub-circuit 204), and is configured to control a first drive current flowing through the first terminal and the second terminal for driving the first light-emitting element L to emit light. For example, the first drive sub-circuit 201 may be implemented as a drive transistor T1, a gate electrode of the drive transistor T1 is connected to the first pixel node U1, a first electrode of the drive transistor T1 is connected to the second pixel point U2, and a second electrode of the drive transistor T1 serves as the second terminal of the first drive sub-circuit 201 and is connected to the first light-emitting control sub-circuit 204.

The first data writing sub-circuit 202 is configured to be connected to the control terminal of the first drive sub-circuit 201, and is configured to write a first data signal to the control terminal of the first drive sub-circuit 201 in response to a first scan signal. For example, the first data writing sub-circuit 202 may be implemented as a data writing transistor T2, a gate electrode of the data writing transistor T2 is connected to the gate drive circuit 20 through a gate line GL to receive the first scan signal G, a first electrode of the data writing transistor T2 is connected to the data drive circuit 30 through a data line DL to receive the first data signal Vdata, and a second electrode of the data writing transistor T2 is connected to the first node N1.

The first storage sub-circuit 203 is configured to be connected to the control terminal and the first terminal of the first drive sub-circuit 201, and is configured to store the first data signal Vdata written by the first data writing sub-circuit 202. For example, the first storage sub-circuit 203 may be implemented to include a storage capacitor C1. A first electrode of the storage capacitor C1 is connected to the first pixel node U1, and a second electrode of the storage capacitor C1 is configured to receive a first voltage VDD.

The first light-emitting control sub-circuit 204 is connected to the first scan drive circuit E1 through the gate line GL to receive the first light-emitting control signal EM, and is configured to apply the first drive current to a first terminal of the first light-emitting element L in response to the first light-emitting control signal EM. For example, the first light-emitting control sub-circuit 204 may be implemented as a light-emitting control transistor T5, a gate electrode of the light-emitting control transistor T5 is configured to be connected to the first scan drive circuit E1 to receive the first light-emitting control signal EM, a first electrode of the light-emitting control transistor T5 is configured to be connected to the second electrode of the drive transistor to receive the drive current, and a second electrode of the light-emitting control transistor T5 is connected to the first terminal (e.g., anode) of the first light-emitting element L to apply the drive current to the first light-emitting element L. For example, the other terminal of the first light-emitting element L serves as a cathode and is connected to a fifth voltage terminal VSS to receive the fifth voltage.

For example, the light-emitting element L may be of various types, such as top emission type, bottom emission type, and the like, and it may emit red light, green light, blue light, or white light, and the embodiments of the present disclosure are not limited thereto.

It should be noted that the fifth voltage VS S in the embodiment of the present disclosure is maintained at a low level and the first voltage VDD is maintained at a high level, for example. In the description of the embodiment of the present disclosure, the first pixel node U1, the second pixel node U2, and the first node N1, the second node N2, and the third node N3 do not represent actual components, but represent junction points of related electrical connections in the circuit diagram. This case can be applied to the following embodiments and will not be described again.

In addition, the transistors used in the embodiments of the present disclosure can be thin film transistors or field effect transistors or other switching devices with the same characteristics, and the embodiments of the present disclosure are all described by taking a case that the transistors are the thin film transistors as an example. A source electrode and a drain electrode of a transistor used here can be symmetrical in structure, so the source electrode and the drain electrode can be structurally indistinguishable. In the embodiment of the present disclosure, in order to distinguish the two electrodes of the transistor except the gate electrode, one electrode is directly described as the first electrode and the other electrode is described as the second pole.

The operation principle of the first pixel circuit 200 as shown in FIG. 6 will be described below with reference to the signal timing diagram as shown in FIG. 7. As shown in FIG. 7, the operation process of the first pixel circuit includes three phases, namely a data writing phase t1, a holding phase t2, and a light-emitting phase t3. FIG. 7 shows the timing waveform of respective signals in respective phases.

In the data writing phase t1, as shown in FIG. 7, the scan signal G is at a high level, the data writing transistor T2 is turned on, and the driving transistor T1 is turned on.

The first data signal Vdata charges the first pixel node U1 (i.e., charges the storage capacitor C1) via the turn-on second transistor T2, that is, a level of the first pixel node U1 is the first data signal Vdata.

In the holding phase t2, as shown in FIG. 7, the scan signal G and the first light-emitting control signal EM are both at low levels, so the data writing transistor T2 and the light-emitting control transistor T4 are turned off while the driving transistor T1 is kept at a turn-on state, so the first pixel circuit 200 does not operate in this phase.

In the light-emitting phase t3, as shown in FIG. 7, the first light-emitting control signal EM is at a high level, and the light-emitting control transistor T5 is turned on. Meanwhile, because a level of the first pixel node U1 is maintained at Vdata and a level of the second pixel node U2 is maintained at the first voltage VDD, the drive transistor T1 remains to be turned on in this phase.

At this time, the anode and cathode of the first light-emitting element L are respectively connected to the first voltage VDD (high level) and the second voltage VSS (low level), thereby emitting light under the action of the drive current flowing through the driving transistor T1.

It should be noted that the circuit structure of the first pixel circuit 200 is not limited to the circuit structure as shown in FIG. 6, but may also be other circuit structures capable of driving the light-emitting element L in the art, such as 4T1C, 6T2C, 8T2C and other pixel circuits, and the embodiment of the present disclosure is not limited thereto.

For example, similar to the structure of the first display region A1, the second display region A2 includes a plurality of second pixel units arranged in an array, each of the plurality of second pixel units includes a first pixel circuit and a second light-emitting element, the second pixel circuit is connected to the second scan drive circuit E2, and is configured to drive the second light-emitting element connected thereto to emit light under control of a second light-emitting control signal, which is received, output by the second scan drive circuit. For example, the second pixel circuit includes a second drive sub-circuit, a second data writing sub-circuit, a second storage sub-circuit, and a second light-emitting control sub-circuit. The second drive sub-circuit includes a control terminal, a first terminal, and a second terminal, and is configured to control a second drive current flowing through the first terminal and the second terminal of the second drive sub-circuit for driving the second light-emitting element to emit light; the second data writing sub-circuit is configured to be connected to the control terminal of the second drive sub-circuit and configured to write a second data signal to the control terminal of the second drive sub-circuit in response to a second scan signal; the second storage sub-circuit is configured to be connected to the control terminal and the first terminal of the second drive sub-circuit and is configured to store the second data signal written by the second data writing sub-circuit; the second light-emitting control sub-circuit is connected to the second scan drive circuit to receive the second light-emitting control signal, and is configured to apply a second voltage to the first terminal of the second drive sub-circuit in response to the second light-emitting control signal.

It should be noted that the circuit structure and operating principle of the second pixel circuit are similar to those of the first pixel circuit, and will not be described herein again. Of course, the second pixel circuit may adopt a circuit structure different from the circuit structure of the first pixel circuit 200 as long as corresponding functions can be realized, and the embodiment of the present disclosure is not limited to this case.

From the above, it can be seen that the first light-emitting element driven by the first pixel circuit 200 as shown in FIG. 6 emits light in the light-emitting phase t3. For example, the light-emitting duration of the first light-emitting element L driven by the first pixel circuit 200 can be adjusted by controlling the duration of the light-emitting phase t3, so that the display duration, that is, the display brightness, of the display region can be controlled. That is to say, the display brightness of the first display region including the first pixel circuit 200 can be adjusted by controlling the pulse width of the first light-emitting control signal EM, so as to achieve to control the display brightness balance of the respective display regions, that is, the display brightness of the respective display regions of the display panel is uniform within a visible range of human eyes, thereby improving the display quality of the display panel.

Specifically, the variation relationship between the pulse width of the light-emitting control signal output by each scan drive circuit and the display duration (i.e., the light-emitting duration of the light-emitting element or the display brightness of the display region) of display region corresponding to the light-emitting control signal is shown in FIG. 8. For example, for the first display region A1, as shown in FIG. 8, as the pulse width of the first light-emitting control signal EM increases continuously, that is, the duration of the light-emitting phase t3 increases continuously, the display duration of the first display region A1 increases continuously, and the display brightness of the first display region A1 increases continuously. Therefore, in the case where the light-emitting brightness of the light-emitting element in the display region becomes low due to long usage duration, the display brightness of the display region can be improved by increasing its light-emitting duration (i.e., the pulse width of the light-emitting control signal).

For example, the pulse width of the first light-emitting control signal EM is the duration of the turn-on level of the light-emitting control transistor. In the example as shown in FIG. 8, in the case where the light-emitting control transistor T4 is an N-type transistor, the pulse width of the first light-emitting control signal EM is the duration of the turn-on level (i.e., high level) of the light-emitting control transistor, for example, the duration of the high level as shown in FIG. 4A or FIG. 4B; and for example, in other examples, in the case where the light-emitting control transistor T4 is a P-type transistor, the pulse width of the first light-emitting control signal EM is the duration of the turn-on level (i.e., low level) of the light-emitting control transistor, for example, the duration of the low level as shown in FIG. 4A or FIG. 4B, and the embodiment of the present disclosure is not limited thereto. For example, the pulse width of the light-emitting control signal corresponding to the display brightness of the display panel can be obtained according to the curve as shown in FIG. 8.

Figure 9:
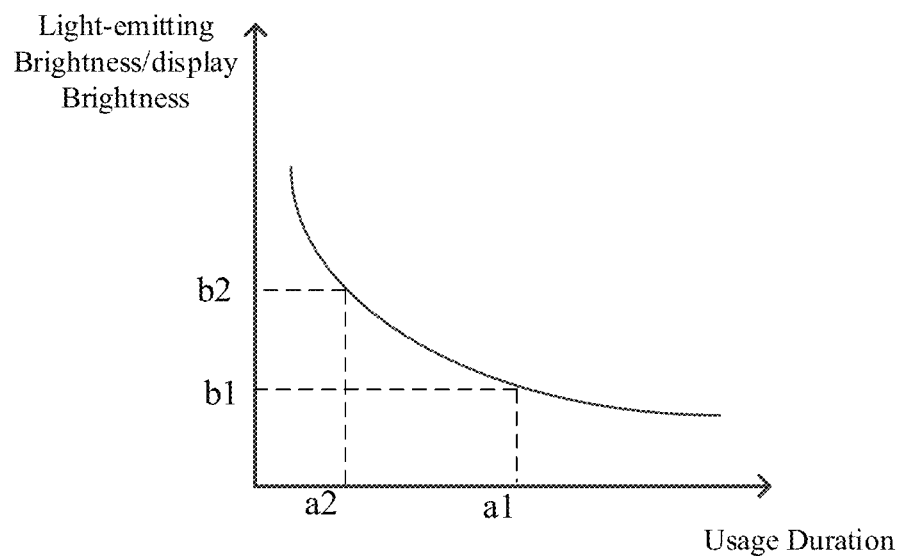
FIG. 9 is a schematic diagram illustrating a relationship between an usage duration of a light-emitting element and a light-emitting brightness of the light-emitting element according to at least one embodiment of the present disclosure.

FIG. 9 is a schematic diagram illustrating a relationship between an usage duration of a light-emitting element (e.g., a first light-emitting element) and a light-emitting brightness (i.e., the display brightness of the display region on which the light-emitting element is located) of the light-emitting element according to at least one embodiment of the present disclosure. As shown in FIG. 9, as the usage duration increases, the light-emitting brightness of the light-emitting element (i.e., the display brightness of the display region on which the light-emitting element is located) gradually decreases. Therefore, in the case where the usage duration of the main screen (for example, the first display region A1) and the usage duration of the auxiliary screen (for example, the second display region A2) are inconsistent, for example, the usage duration of the main screen is a1, the corresponding display brightness is b1, the usage duration of the auxiliary screen is a2, and the corresponding display brightness is b2, because the display brightness b1 of the main screen is lower than the display brightness b2 of the auxiliary screen, in the case where the display brightness difference is perceived by human eyes, a yin-yang screen will appear, affecting the display quality of the display panel.

For example, in some examples, in the case where only the display duration of a display region where the display brightness is attenuated, such as the main screen, is adjusted, by combining the two curves as shown in FIGS. 8 and 9, a light-emitting brightness balance point c of the light-emitting element, that is, the balance point where the yin-yang screen phenomenon does not occur, can be obtained. For example, in the case where the usage duration of the light-emitting element is a1, the light-emitting brightness of the light-emitting element is b1 at this time, through the light-emitting brightness balance point c, the light-emitting brightness b3 of the light-emitting element in the case where the display region is normally displayed (i.e., yin-yang screen phenomenon does not occur) can be obtained. For example, the light-emitting brightness b3 and the light-emitting brightness b1 are symmetrical about the light-emitting brightness balUsage ance point c. Then, the pulse width of the light-emitting control signal actually corresponding to the light-emitting brightness b3 is acquired based on a curve 2 (i.e., the curve as shown in FIG. 8). Because the pulse width of the light-emitting control signal is the same as the pulse width of the trigger signal, the trigger signal with the pulse width can be output to the corresponding scan drive circuit by the controller 10 to control the display duration of the corresponding display region, so that the main screen and auxiliary screen can maintain the same brightness under different usage durations, thereby improving the display quality.

For example, the pulse width of the light-emitting control signal corresponding to the corresponding display region can be obtained according to mathematical models respectively obtained by the curve as shown in FIG. 8 and the curve as shown in FIG. 9. Of course, it can also be obtained according to a look-up table regarding the usage duration of the display region and the pulse width of the received light-emitting control signal, and the embodiment of the present disclosure is not limited thereto.

For example, in some examples, in the case where it is necessary to relatively increase the display duration of the first display region A1 within one display period, for example, the usage duration of the first display region A1 is longer than the usage duration of the second display region A2, that is, the display brightness of the first display region A1 is less than the display brightness of the second display region A2, the controller 10 is configured to enable the pulse width of the first light-emitting control signal to be greater than the pulse width of the second light-emitting control signal, that is, the pulse width of the first trigger signal output by the controller 10 to the first scan drive circuit E1 is greater than the pulse width of the second trigger signal output by the controller 10 to the second scan drive circuit E2, so that the display duration of the first display region A1 in one display period is longer than the display duration of the second display region A2 in one display period to improve the display brightness of the first display region A1, thereby avoiding the phenomenon of yin-yang screen.

For example, the pulse width of the first light-emitting control signal may be greater than the pulse width of the second light-emitting control signal by adjusting the pulse width of the at least one of the first light-emitting control signal and the second light-emitting control signal. For example, the pulse width of the first light-emitting control signal may be increased, or the pulse width of the second light-emitting control signal may be decreased, or the pulse width of the first light-emitting control signal may be increased and the pulse width of the second light-emitting control signal may be decreased, so that the pulse width of the first light-emitting control signal is greater than the pulse width of the second light-emitting control signal. For example, in this example, by increasing the pulse width of the first light-emitting control signal to improve the display uniformity of the display panel, the display quality of the display panel can be improved without changing the display brightness of the display panel.

Figure 12:
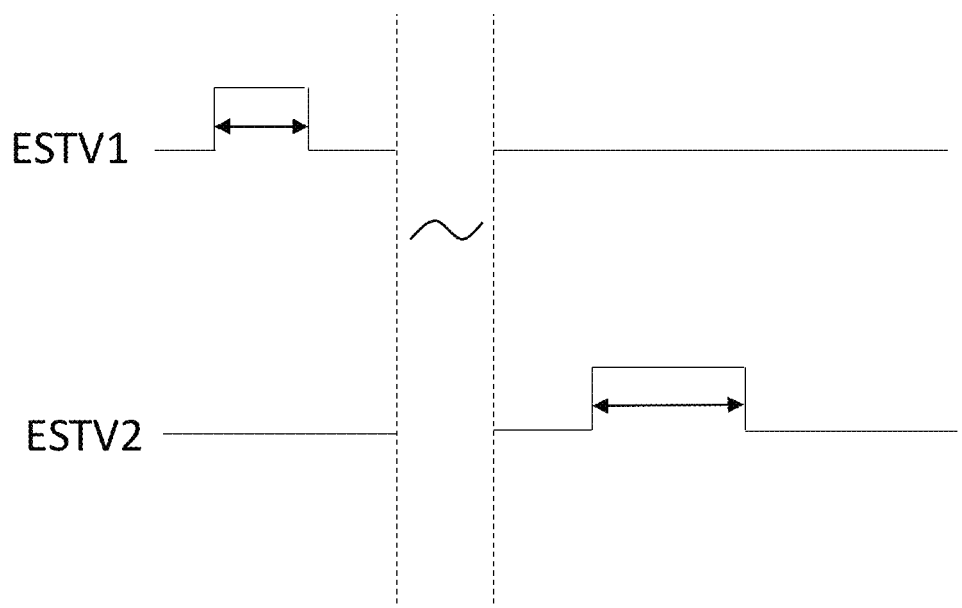
FIG. 12 is another schematic diagram of a pulse width of a first trigger signal and a pulse width of a second trigger signal according to at least one embodiment of the present disclosure.

For example, in some examples, in the case where it is necessary to relatively increase the display duration of the second display region within one display period, for example, the usage duration of the second display region A2 is longer than the usage duration of the first display region A1, that is, the display brightness of the second display region A2 is less than the display brightness of the first display region A1, the controller 10 is configured to enable the pulse width of the first light-emitting control signal to be less than the pulse width of the second light-emitting control signal, i.e., as shown in FIG. 12, the pulse width of the first trigger signal ESTV1 output by the controller 10 to the first scan drive circuit is less than the pulse width of the second trigger signal ESTV2 output by the controller 10 to the second scan drive circuit, so that the display duration of the first display region in one display period is less than the display duration of the second display region, so as to improve the display brightness of the second display region, thereby avoiding the phenomenon of yin-yang screen.

For example, the pulse width of the first light-emitting control signal may be less than the pulse width of the second light-emitting control signal by adjusting the pulse width of the at least one of the first light-emitting control signal and the second light-emitting control signal. For example, the pulse width of the first light-emitting control signal may be decreased, or the pulse width of the second light-emitting control signal may be increased, or the pulse width of the first light-emitting control signal may be decreased and the pulse width of the second light-emitting control signal may be increased, so that the pulse width of the first light-emitting control signal is less than the pulse width of the second light-emitting control signal. For example, in this example, by increasing the pulse width of the second light-emitting control signal to improve the display uniformity of the display panel, the display quality of the display panel can be improved without changing the display brightness of the display panel.

For example, in some examples, because the usage duration of the light-emitting elements is shorter, the light-emitting elements of the first display region A1 and the second display region A2 have no difference or small difference in lifetime attenuation and cannot be perceived by human eyes at an usage initial phase. At this time, the pulse width of the first light-emitting control signal can be equal to the pulse width of the second light-emitting control signal, that is, the controller 10 does not need to adjust the trigger signals of the respective display regions. For example, at this time, the pulse widths of the first trigger signal and the second trigger signal are substantially the same as shown in FIG. 11, for example.

Figure 10:
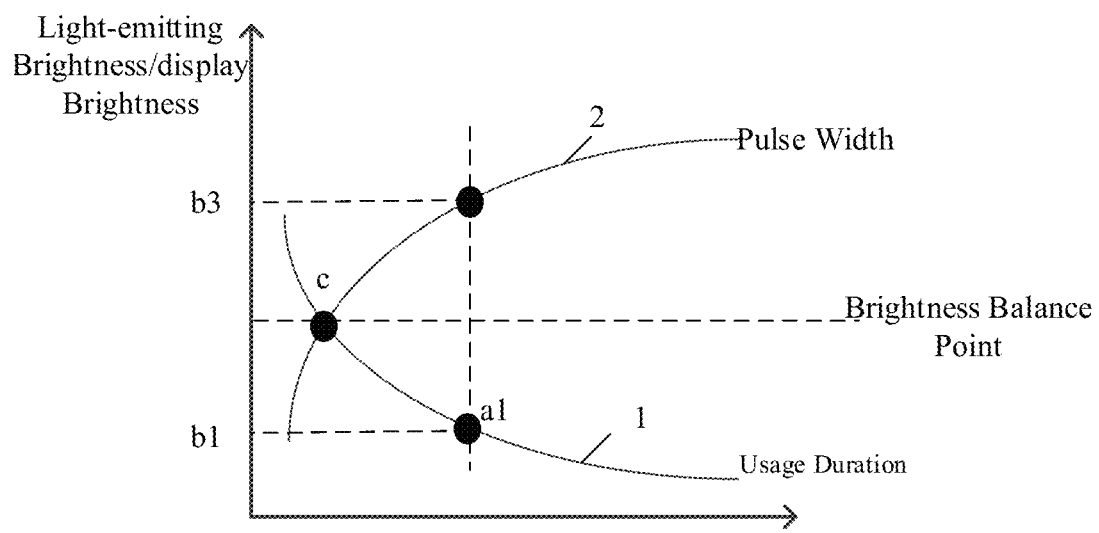
FIG. 10 is a graph illustrating a usage duration of a light-emitting element and a pulse width of a light-emitting control signal according to at least one embodiment of the present disclosure.
Figure 11:
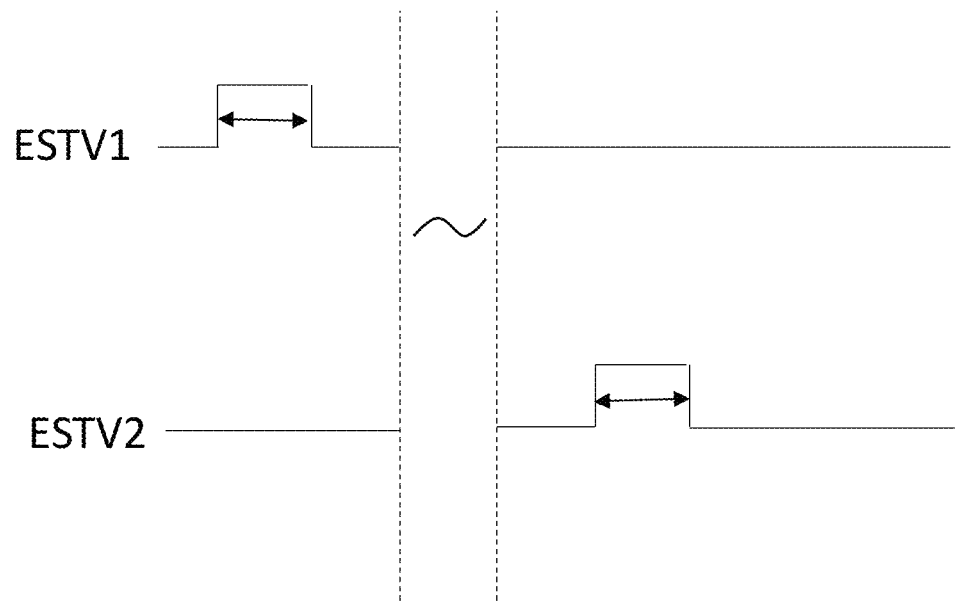
FIG. 11 is a schematic diagram of a pulse width of a first trigger signal and a pulse width of a second trigger signal according to at least one embodiment of the present disclosure.

For example, in some examples, a plurality of display brightness may be extracted from a plurality of display brightness (e.g., 0 nit-400 nit) of a display region according to the characteristics of visual stay of human eyes, and pulse widths (waveforms as shown in FIG. 11) of the trigger signals corresponding to the plurality of display brightness may be stored in a memory 40 (shown in FIG. 2A). For example, as shown in FIG. 2A, the memory 40 may be located outside the controller 10 and connected to the controller 10, or may be located in the controller 10, and the embodiment of the present disclosure is not limited to this case. In the case where the display brightness b3 and the pulse width corresponding to the display brightness b3 are obtained according to, for example, the curve as shown in FIG. 10, the controller 10 calls the trigger signal of the pulse width from the memory and outputs the trigger signal to the corresponding scan drive circuit, thereby realizing the adjustment of the pulse widths of the trigger signals in different display regions.

According to the display panel provided by at least one embodiment of the present disclosure, by connecting a plurality of display regions and a plurality of scan drive circuits in one-to-one correspondence, the individual adjustment of the respective display regions can be realized, so that the pulse width of light-emitting pulse signals can be respectively adjusted according to the difference of the display brightness of the respective display regions, thereby avoiding the appearance of yin-yang screen in the display process of the display panel and improving the display quality of the display panel.

At least one embodiment of the present disclosure also provides a display drive method corresponding to the display panel. For example, as shown in FIG. 2B, the display drive method of the display panel is described by taking a case that the plurality of display regions of the display panel include the first display region A1 and the second display region A2 which are parallel to each other and do not overlap with each other, and the plurality of scan drive circuits include the first scan drive circuit E1 and the second scan drive circuit E2 as an example, but the embodiment of the present disclosure is not limited thereto.

For example, the display drive method includes: adjusting a pulse width of the at least one of the first light-emitting control signal and the second light-emitting control signal to adjust the display duration of the first display region and the display duration of the second display region within one display period, respectively. For example, the adjustment of the first light-emitting control signal and the second light-emitting control signal may be realized by the controller 10.

For example, in some examples, the first scan drive circuit E1 includes N cascaded first shift registers and the second scan drive circuit includes M cascaded second shift registers. The first stage of first shift register in the N cascaded first shift registers receives the first trigger signal, the first scan drive circuit outputs the first light-emitting control signal row by row through the N cascaded first shift registers in response to the first trigger signal, the first stage of second shift register in the N cascaded second shift registers receives the second trigger signal, and the second scan drive circuit outputs the second light-emitting control signal row by row through the M cascaded second shift registers in response to the second trigger signal.

For example, the display drive method further includes: in the case of outputting the first light-emitting control signal from a last stage of first shift register of the first scan drive circuit, providing the second trigger signal to the first stage of second shift register of the second scan drive circuit to drive the M cascaded second shift registers to output the second light-emitting control signal row by row.

It should be noted that the detailed description of the first scan drive circuit E1 and the second scan drive circuit E2 can refer to the description of FIGS. 3-5 and will not be repeated herein again.

For example, in some examples, adjusting the pulse width of the at least one of the first light-emitting control signal and the second light-emitting control signal includes changing the pulse width of the at least one of the first trigger signal received by the first scan drive circuit and the second trigger signal received by the second scan drive circuit to adjust the pulse width of the at least one of the first light-emitting control signal and the second light-emitting control signal accordingly. For example, the pulse width of the first light-emitting control signal is the same as the pulse width of the first trigger signal, and the pulse width of the second light-emitting control signal is the same as the pulse width of the second trigger signal.

For example, in the case where it is necessary to relatively increase the display duration of the first display region A1 within one display period, adjusting the pulse width of the at least one of the first light-emitting control signal and the second light-emitting control signal includes: increasing the pulse width of the first light-emitting control signal, or decreasing the pulse width of the second light-emitting control signal, or increasing the pulse width of the first light-emitting control signal and decreasing the pulse width of the second light-emitting control signal, so that the pulse width of the first light-emitting control signal is greater than the pulse width of the second light-emitting control signal.

For example, in the case where it is necessary to relatively increase the display duration of the second display region within one display period, adjusting the pulse width of the at least one of the first light-emitting control signal and the second light-emitting control signal includes: decreasing the pulse width of the first light-emitting control signal or increasing the pulse width of the second light-emitting control signal, or decreasing the pulse width of the first light-emitting control signal and increasing the pulse width of the second light-emitting control signal, so that the pulse width of the first light-emitting control signal is less than the pulse width of the second light-emitting control signal.

For example, the adjustment of the first light-emitting control signal and the second light-emitting control signal can be determined according to the curves or mathematical models or look-up tables as shown in FIGS. 8-10, and the detailed process can refer to the above description and will not be repeated herein again.

For example, in some examples, the display drive method further includes: acquiring a corresponding relationship between the continuous usage duration of each of the plurality of display regions and the pulse width of the received light-emitting control signal; and acquiring the pulse width of the first light-emitting control signal and the pulse width of the second light-emitting control signal, which are adjusted, based on the corresponding relationship, a continuous usage duration of the first display region, and a continuous usage duration of the second display region.

For example, the correspondence relationship may be a mathematical model obtained, for example, from the curves as shown in FIGS. 8-10, or may be a look-up table regarding the continuous usage duration of the display region and the pulse width of the received light-emitting control signal, and the embodiment of the present disclosure is not limited to this case.

For example, in some examples, the display drive method further includes: acquiring a signal indicating a folded state of the display panel and a signal indicating a display state of the display panel, and controlling operating states of the first scan drive circuit and the second scan drive circuit based on the signal indicating the folded state and the signal indicating the display state.

For example, in this example, the signal indicating the folded state of the display panel indicates a case where the display panel is folded such that the first display region A1 and the second display region A2 at least partially overlap (as shown in FIG. 2C), that is, in the case where the display panel is in the folded state, the display drive method further includes: in a case where the second display region does not display, disabling the second scan drive circuit to output the second light-emitting control signal and simultaneously stopping recording a continuous usage duration of the second display region. That is, only the first scan drive circuit is driven to output the first light-emitting control signal, thereby driving the first display region A1 to display and the second display region A2 not to display. In the case where the second display region is used for display, the second scan drive circuit is enabled to output the second light-emitting control signal, and the continuous usage duration of the second display region is continuously recorded.

For example, in some examples, the continuous usage duration of the second display region A2 may be recorded by a timer. For example, the timer may be located in the memory 40, and the continuous usage duration of the second display region A2 may be recorded by acquiring marks indicating the folded state of the display panel and the display state of the display panel.

For example, the folded state may be sensed by a sensor located on the display panel, and in the case where the display panel is folded or the respective display regions of the display panel (e.g., the first display region A1 and the second display region A2) are close to each other, the sensor is triggered, and a mark indicating the folded state of the display panel is transmitted to the memory 40 of the display panel, for example. For example, a mark indicating the display state may be transmitted to the memory 40 of the display panel, for example, by means of a sensor detecting whether the light-emitting element emits light or whether there is a scan signal. For example, in the case where the timer acquires the mark indicating the folded state and the display state of the display panel, the timer is started; and in the case where the timer does not detect the mark indicating the display state of the display panel, the timer ends to acquire the continuous usage duration of the second display region A2. For example, the mark indicating the folded state of the display panel may also be obtained by the controller 10 detecting the above-mentioned signal indicating the folded state of the display panel, and the embodiment of the present disclosure is not limited thereto.

The technical effect of the display drive method of the display panel provided by the above embodiment may refer to the technical effect of the display panel provided by the embodiment of the present disclosure, which will not be repeated herein again.

Figure 13:
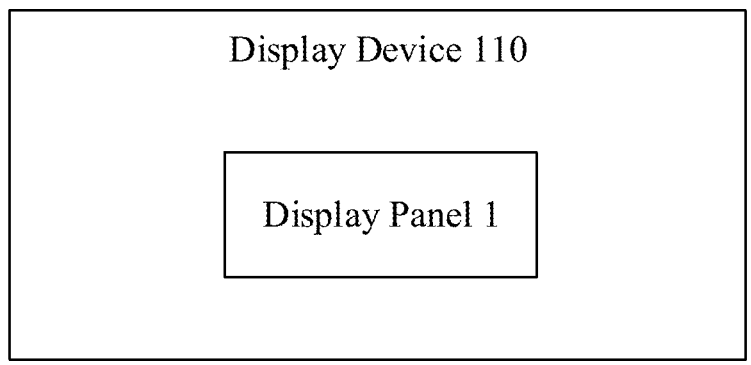
FIG. 13 is a schematic diagram of a display device according to at least one embodiment of the present disclosure.

At least one embodiment of the present disclosure also provides a display device. FIG. 13 is a schematic diagram of a display device according to at least one embodiment of the present disclosure. As shown in FIG. 13, the display device 110 includes the display panel of any one of embodiments of the present disclosure, for example, the display panel 1 as shown in FIG. 2A.

It should be noted that the display device 110 in this embodiment can be any product or component with display function, such as OLED panel, OLED TV, mobile phone, tablet computer, notebook computer, digital photo frame, navigator, etc. The display device 110 may also include other components, and the embodiments of the present disclosure are not limited thereto.

It should be noted that the entire structure of the display device 110 is not shown for clarity and conciseness. In order to realize the necessary functions of the display device, those skilled in the art can set other structures not shown according to specific application scenarios, and the embodiments of the present disclosure are not limited to this case.

The technical effect of the display device 110 provided by the embodiment of the present disclosure may refer to the corresponding description of the display panel 1 in the above-mentioned embodiment and will not be repeated herein again.

The following points need to be explained:
(1) The drawings of the embodiments of the present disclosure only refer to the structures related to the embodiments of the present disclosure, and other structures may refer to the general design.
(2) In case of no conflict, the embodiments of the present disclosure and the features in the embodiments can be combined with each other to obtain new embodiments.

What have been described above merely are specific implementations of the present disclosure, but the protective scope of the present disclosure is not limited to this case. The protective scope of the present disclosure is determined by the appended claims.

What is claimed is:

1. A display drive method for driving a display panel, wherein the display panel comprises a plurality of display regions and a plurality of scan drive circuits, the plurality of display regions comprise a first display region and a second display region that are parallel to each other and do not overlap with each other, the plurality of scan drive circuits comprise a first scan drive circuit and a second scan drive circuit, the first display region is connected to the first scan drive circuit to receive a first light-emitting control signal provided by the first scan drive circuit, the second display region is connected to the second scan drive circuit to receive a second light-emitting control signal provided by the second scan drive circuit, the display drive method comprising:

individually adjusting a pulse width of at least one of the first light-emitting control signal and the second light-emitting control signal to adjust a light-emitting duration of light-emitting elements of the first display region and a light-emitting duration of light-emitting elements of the second display region within one display period, respectively based on a light-emitting brightness balance point of the light-emitting elements of the first display region or a light-emitting brightness balance point of the light-emitting elements of the second display region, wherein the light-emitting brightness balance point of the light-emitting elements of the first display region is an intersection of a first curve and a second curve, the first curve indicating the relationship between the usage duration of light-emitting elements of the first display region and the brightness of light-emitting elements of the first display region, the second curve indicating the relationship between brightness of light-emitting elements of the first display region and the pulse width of the first light-emitting control signal, or the light-emitting brightness balance point of the light-emitting elements of the second display region is an intersection of a third curve and a fourth curve, the third curve indicating the relationship between the usage duration of light-emitting elements of the second display region and the brightness of light-emitting elements of the second display region, the fourth curve indicating the relationship between brightness of light-emitting elements of the second display region and the pulse width of the second light-emitting control signal.

2. The display drive method for driving the display panel according to claim 1, wherein the display panel comprises a controller, a first trigger signal line, a second trigger signal line, and clock signal lines, and the first trigger signal line, the second trigger signal line, and the clock signal lines are connected to the controller;

the first scan drive circuit comprises N cascaded first shift registers, and the second scan drive circuit comprises M cascaded second shift registers, wherein:

the N cascaded first shift registers and the M cascaded second shift registers are respectively connected to the clock signal lines to receive clock signals provided by the controller, a first stage of first shift register in the N cascaded first shift registers is connected to the first trigger signal line to receive a first trigger signal provided by the controller, and the first scan drive circuit outputs the first light-emitting control signal row by row through the N cascaded first shift registers in response to the first trigger signal and the clock signals, a first stage of second shift register in the M cascaded second shift registers is connected to the second trigger signal line to receive a second trigger signal provided by the controller, and the second scan drive circuit outputs the second light-emitting control signal row by row through the M cascaded second shift registers in response to the second trigger signal and the clock signals; and wherein N and M are integers greater than 1.

3. The display drive method for driving the display panel according to claim 2, wherein adjusting the pulse width of the at least one of the first light-emitting control signal and the second light-emitting control signal, comprises:

changing the pulse width of the at least one of the first trigger signal received by the first scan drive circuit and the second trigger signal received by the second scan drive circuit to adjust the pulse width of the at least one of the first light-emitting control signal and the second light-emitting control signal accordingly.

4. The display drive method for driving the display panel according to claim 2, wherein a change amount of the pulse width of the at least one of the first trigger signal received by the first scan drive circuit and the second trigger signal received by the second scan drive circuit is an integer multiple of a pulse period of the clock signals.

5. The display drive method for driving the display panel according to claim 2, further comprising:

in a case of outputting the first light-emitting control signal from a last stage of first shift register of the first scan drive circuit, providing the second trigger signal to a first stage of second shift register of the second scan drive circuit to drive the M cascaded second shift registers to output the second light-emitting control signal row by row.

6. The display drive method for driving the display panel according to claim 2, further comprising:

providing the first trigger signal to the first scan drive circuit while providing the second trigger signal to the second scan drive circuit.

7. The display drive method for driving the display panel according to claim 1, wherein in a case where the light-emitting duration of the light-emitting elements in the first display region in the one display period is necessary to be relatively increased, adjusting the pulse width of the at least one of the first light-emitting control signal and the second light-emitting control signal, comprises:

increasing the pulse width of the first light-emitting control signal, or decreasing the pulse width of the second light-emitting control signal, or increasing the pulse width of the first light-emitting control signal and decreasing the pulse width of the second light-emitting control signal, so that the pulse width of the first light-emitting control signal is greater than the pulse width of the second light-emitting control signal; or in a case where the light-emitting duration of the light-emitting elements in the second display region in the one display period needs to be relatively increased, adjusting the pulse width of the at least one of the first light-emitting control signal and the second light-emitting control signal, comprises:

decreasing the pulse width of the first light-emitting control signal, or increasing the pulse width of the second light-emitting control signal, or decreasing the pulse width of the first light-emitting control signal and increasing the pulse width of the second light-emitting control signal, so that the pulse width of the first light-emitting control signal is less than the pulse width of the second light-emitting control signal.

8. The display drive method for driving the display panel according to claim 1, further comprising:

acquiring a corresponding relation between a continuous usage duration of each of the plurality of display regions and the pulse width of the light-emitting control signal which is received; and acquiring the pulse width of the first light-emitting control signal and the pulse width of the second light-emitting control signal, which are adjusted, based on the corresponding relationship, a continuous usage duration of the first display region, and a continuous usage duration of the second display region.

9. The display drive method for driving the display panel according to claim 1, wherein the display panel is a foldable display panel and comprises a folding axis, the first display region and the second display region are divided along the folding axis, and the display drive method further comprises:
acquiring a signal indicating a folded state of the display panel and a signal indicating a display state of the display panel, and controlling operating states of the first scan drive circuit and the second scan drive circuit based on the signal indicating the folded state and the signal indicating the display state.

10. The display drive method for driving the display panel according to claim 9, wherein in a case where the signal indicating the folded state of the display panel indicates that the display panel is folded such that the first display region and the second display region at least partially overlap, the display drive method further comprises:
in a case where the second display region does not display, disabling the second scan drive circuit to output the second light-emitting control signal and simultaneously stopping recording a continuous usage duration of the second display region; and
in a case where the second display region is used for display, enabling the second scan drive circuit to output the second light-emitting control signal, and continuously recording the continuous usage duration of the second display region.

11. A display panel, comprising a plurality of display regions, a plurality of scan drive circuits, and a controller, wherein the plurality of display regions comprise a first display region and a second display region that are parallel to each other and do not overlap with each other, the plurality of scan drive circuits comprise a first scan drive circuit and a second scan drive circuit; wherein,
the controller is electrically connected to the first scan drive circuit and the second scan drive circuit to control the first scan drive circuit and the second scan drive circuit to output a first light-emitting control signal and a second light-emitting control signal, respectively;
the first display region is electrically connected to the first scan drive circuit to receive the first light-emitting control signal;
the second display region is electrically connected to the second scan drive circuit to receive the second light-emitting control signal; and
the controller is configured to individually adjust a pulse width of at least one of the first light-emitting control signal and the second light-emitting control signal to adjust a light-emitting duration of light-emitting elements of the first display region and a light-emitting duration of light-emitting elements of the second display region within one display period, respectively, based on a light-emitting brightness balance point of the light-emitting elements of the first display region or a light-emitting brightness balance point of the light-emitting elements of the second display region,
wherein the light-emitting brightness balance point of the light-emitting elements of the first display region is an intersection of a first curve and a second curve, the first curve indicating the relationship between the usage duration of light-emitting elements of the first display region and the brightness of light-emitting elements of the first display region, the second curve indicating the relationship between brightness of light-emitting elements of the first display region and the pulse width of the first light-emitting control signal, or
the light-emitting brightness balance point of the light-emitting elements of the second display region is an intersection of a third curve and a fourth curve, the third curve indicating the relationship between the usage duration of light-emitting elements of the second display region and the brightness of light-emitting elements of the second display region, the fourth curve indicating the relationship between brightness of light-emitting elements of the second display region and the pulse width of the second light-emitting control signal.

12. The display panel according to claim 11, wherein
the display panel comprises the controller, a first trigger signal line, a second trigger signal line, and clock signal lines, and the first trigger signal line, the second trigger signal line, and the clock signal lines are connected to the controller;
the first scan drive circuit comprises N cascaded first shift registers, and the second scan drive circuit comprises M cascaded second shift registers,
wherein the N cascaded first shift registers and the M cascaded second shift registers are respectively connected to the clock signal lines to receive clock signals provided by the controller,
a first stage of first shift register in the N cascaded first shift registers is connected to the first trigger signal line to receive a first trigger signal provided by the controller, and the first scan drive circuit outputs the first light-emitting control signal row by row through the N cascaded first shift registers in response to the first trigger signal and the clock signals,
a first stage of second shift register in the M cascaded second shift registers is connected to the second trigger signal line to receive a second trigger signal provided by the controller, and the second scan drive circuit outputs the second light-emitting control signal row by row through the M cascaded second shift registers in response to the second trigger signal and the clock signals; and
wherein N and M are integers greater than 1.

13. The display panel according to claim 12, wherein a change amount of the pulse width of the at least one of the first trigger signal received by the first scan drive circuit and the second trigger signal received by the second scan drive circuit is an integer multiple of a pulse period of the clock signals.

14. The display panel according to claim 12, wherein the controller is further configured to provide the second trigger signal to the second scan drive circuit to output the second light-emitting control signal row by row in a case of outputting the first light-emitting control signal from a last stage of first shift register of the first scan drive circuit; or to provide the first trigger signal to the first scan drive circuit while providing the second trigger signal to the second scan drive circuit.

15. The display panel according to claim 12, wherein the display panel further comprises a memory, the memory being connected with the controller or located in the controller, wherein:
the first trigger signal and the second trigger signal are stored in the memory;
a timer is located in the memory;
a mark indicating a folded state of the display panel is transmitted to the memory;
wherein in case where the timer acquires the mark, the timer is started; and in case where the timer does not detect the mark, the timer ends to acquire the continuous usage duration of the second display region.

16. The display panel according to claim 11, wherein the controller is further configured to enable the pulse width of the first light-emitting control signal to be greater than the pulse width of the second light-emitting control signal in a case where the light-emitting duration of the light-emitting elements in the first display region in the one display period needs to be relatively increased; and enable the pulse width of the first light-emitting control signal to be less than the pulse width of the second light-emitting control signal in a case where the light-emitting duration of the light-emitting elements in the second display region in the one display period needs to be relatively increased.

17. The display panel according to claim 11, wherein the first display region comprises a plurality of first pixel units arranged in an array, each of the plurality of first pixel units comprises a first pixel circuit and a first light-emitting element, the second display region comprises a plurality of second pixel units arranged in an array, and each of the plurality of second pixel units comprises a second pixel circuit and a second light-emitting element;

the first pixel circuit is configured to drive the first light-emitting element, which is connected to the first pixel circuit, to emit light; and the second pixel circuit is configured to drive the second light-emitting element, which is connected to the second pixel circuit, to emit light.

18. The display panel according to claim 17, wherein the first pixel circuit comprises a first drive sub-circuit, a first data writing sub-circuit, a first storage sub-circuit, and a first light-emitting control sub-circuit, and the second pixel circuit comprises a second drive sub-circuit, a second data writing sub-circuit, a second storage sub-circuit, and a second light-emitting control sub-circuit;

the first driving sub-circuit comprises a control terminal, a first terminal, and a second terminal, and is configured to control a first drive current flowing through the first terminal and the second terminal for driving the first light-emitting element to emit light;

the first data writing sub-circuit is connected to the control terminal of the first drive sub-circuit, and is configured to write a first data signal to the control terminal of the first drive sub-circuit in response to a first scan signal;

the first storage sub-circuit is connected to the control terminal and the first terminal of the first drive sub-circuit, and is configured to store the first data signal written by the first data writing sub-circuit;

the first light-emitting control sub-circuit is connected to the first scan drive circuit to receive the first light-emitting control signal, and is configured to apply the first drive current to a first terminal of the first light-emitting element in response to the first light-emitting control signal;

the second drive sub-circuit comprises a control terminal, a first terminal, and a second terminal, and is configured to control a second drive current flowing through the first terminal and the second terminal for driving the second light-emitting element to emit light;

the second data writing sub-circuit is connected to the control terminal of the second drive sub-circuit, and is configured to write a second data signal to the control terminal of the second drive sub-circuit in response to a second scan signal;

the second storage sub-circuit is connected to the control terminal and the first terminal of the second drive sub-circuit, and is configured to store the second data signal written by the second data writing sub-circuit; and the second light-emitting control sub-circuit is connected to the second scan drive circuit to receive the second light-emitting control signal, and is configured to apply the second drive current to the first terminal of the second drive sub-circuit in response to the second light-emitting control signal.

19. The display panel according to claim 11, further comprising a folding axis, wherein the first display region and the second display region are divided along the folding axis.

20. A display device, comprising the display panel according to claim 11.

* * * * *